(12) United States Patent
Londergan et al.

(10) Patent No.: US 8,164,815 B2
(45) Date of Patent: Apr. 24, 2012

(54) MEMS CAVITY-COATING LAYERS AND METHODS

(75) Inventors: Ana R. Londergan, Santa Clara, CA (US); Bangalore R. Natarajan, Cupertino, CA (US); Evgeni Gousev, Saratoga, CA (US); James Randolph Webster, San Jose, CA (US); David Heald, Solvang, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 0 days.

(21) Appl. No.: 12/795,294

(22) Filed: Jun. 7, 2010

(65) Prior Publication Data
US 2010/0245979 A1    Sep. 30, 2010

Related U.S. Application Data

(62) Division of application No. 11/689,430, filed on Mar. 21, 2007, now Pat. No. 7,733,552.

(51) Int. Cl.
*G02F 1/00* (2006.01)
(52) U.S. Cl. ........................................ 359/237
(58) Field of Classification Search .................. 359/290, 359/291, 292, 245, 248, 254, 260, 223, 224
See application file for complete search history.

(56) References Cited

U.S. PATENT DOCUMENTS

| | | | |
|---|---|---|---|
| 3,656,836 A | 4/1972 | de Cremoux et al. |
| 4,190,488 A | 2/1980 | Winters |
| 4,377,324 A | 3/1983 | Durand et al. |
| 4,403,248 A | 9/1983 | te Velde |
| 4,459,182 A | 7/1984 | te Velde |
| 4,482,213 A | 11/1984 | Piliavin et al. |
| 4,498,953 A | 2/1985 | Cook et al. |
| 4,500,171 A | 2/1985 | Penz et al. |
| 4,519,676 A | 5/1985 | te Velde |
| 4,560,435 A | 12/1985 | Brown et al. |
| 4,566,935 A | 1/1986 | Hornbeck |
| 4,710,732 A | 12/1987 | Hornbeck |
| 4,863,245 A | 9/1989 | Roxlo |
| 4,880,493 A | 11/1989 | Ashby et al. |
| 4,900,395 A | 2/1990 | Syverson et al. |

(Continued)

FOREIGN PATENT DOCUMENTS

CH    680534    9/1992

(Continued)

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

(Continued)

*Primary Examiner* — Ricky Mack
*Assistant Examiner* — Tuyen Tra
(74) *Attorney, Agent, or Firm* — Knobbe, Martens, Olson & Bear LLP

(57) ABSTRACT

Devices, methods, and systems comprising a MEMS device, for example, an interferometric modulator, that comprises a cavity in which a layer coats multiple surfaces. The layer is conformal or non-conformal. In some embodiments, the layer is formed by atomic layer deposition (ALD). Preferably, the layer comprises a dielectric material. In some embodiments, the MEMS device also exhibits improved characteristics, such as improved electrical insulation between moving electrodes, reduced stiction, and/or improved mechanical properties.

18 Claims, 21 Drawing Sheets

U.S. PATENT DOCUMENTS

| | | | |
|---|---|---|---|
| 4,925,259 A | 5/1990 | Emmett | |
| 4,954,789 A | 9/1990 | Sampsell | |
| 4,956,619 A | 9/1990 | Hornbeck | |
| 4,965,562 A | 10/1990 | Verhulst | |
| 5,061,049 A | 10/1991 | Hornbeck | |
| 5,078,479 A | 1/1992 | Vuilleumier | |
| 5,083,857 A | 1/1992 | Hornbeck | |
| 5,099,353 A | 3/1992 | Hornbeck | |
| 5,124,834 A | 6/1992 | Cusano et al. | |
| 5,142,405 A | 8/1992 | Hornbeck | |
| 5,190,637 A | 3/1993 | Guckel | |
| 5,216,537 A | 6/1993 | Hornbeck | |
| 5,218,472 A | 6/1993 | Jozefowicz et al. | |
| 5,226,099 A | 7/1993 | Mignardi et al. | |
| 5,231,532 A | 7/1993 | Magel et al. | |
| 5,293,272 A | 3/1994 | Jannson et al. | |
| 5,312,512 A | 5/1994 | Allman et al. | |
| 5,324,683 A | 6/1994 | Fitch et al. | |
| 5,345,328 A | 9/1994 | Fritz et al. | |
| 5,381,040 A | 1/1995 | Sun et al. | |
| 5,381,232 A | 1/1995 | van Wijk | |
| 5,454,906 A | 10/1995 | Baker et al. | |
| 5,474,865 A | 12/1995 | Vasudev | |
| 5,488,505 A | 1/1996 | Engle | |
| 5,526,688 A | 6/1996 | Boysel et al. | |
| 5,578,976 A | 11/1996 | Yao | |
| 5,583,688 A | 12/1996 | Hornbeck | |
| 5,597,736 A | 1/1997 | Sampsell | |
| 5,602,671 A | 2/1997 | Hornbeck | |
| 5,646,768 A | 7/1997 | Kaeiyama | |
| 5,656,554 A | 8/1997 | Desai et al. | |
| 5,665,997 A | 9/1997 | Weaver et al. | |
| 5,674,757 A | 10/1997 | Kim | |
| 5,683,649 A | 11/1997 | Chatterjee et al. | |
| 5,719,068 A | 2/1998 | Suzawa et al. | |
| 5,726,480 A | 3/1998 | Pister | |
| 5,737,050 A | 4/1998 | Takahara et al. | |
| 5,771,321 A | 6/1998 | Stern | |
| 5,784,189 A | 7/1998 | Bozler et al. | |
| 5,784,212 A | 7/1998 | Hornbeck | |
| 5,818,095 A | 10/1998 | Sampsell | |
| 5,822,110 A | 10/1998 | Dabbaj | |
| 5,822,170 A | 10/1998 | Cabuz et al. | |
| 5,824,608 A | 10/1998 | Gotoh et al. | |
| 5,825,528 A | 10/1998 | Goosen | |
| 5,835,255 A * | 11/1998 | Miles | 359/291 |
| 5,835,256 A | 11/1998 | Huibers | |
| 5,896,796 A | 4/1999 | Chih | |
| 5,943,155 A | 8/1999 | Goossen | |
| 5,945,980 A | 8/1999 | Moissey et al. | |
| 5,959,763 A | 9/1999 | Bozler et al. | |
| 5,967,163 A | 10/1999 | Pan et al. | |
| 5,976,902 A | 11/1999 | Shih | |
| 5,986,796 A | 11/1999 | Miles | |
| 5,994,174 A | 11/1999 | Carey et al. | |
| 6,008,123 A | 12/1999 | Kook et al. | |
| 6,031,653 A | 2/2000 | Wang | |
| 6,040,937 A | 3/2000 | Miles | |
| 6,046,659 A | 4/2000 | Loo et al. | |
| 6,088,162 A | 7/2000 | Someno | |
| 6,097,145 A | 8/2000 | Kastalsky et al. | |
| 6,099,132 A | 8/2000 | Kaeriyama | |
| 6,137,150 A | 10/2000 | Takeuchi et al. | |
| 6,160,833 A | 12/2000 | Floyd et al. | |
| 6,162,657 A | 12/2000 | Schiele et al. | |
| 6,165,890 A | 12/2000 | Kohl et al. | |
| 6,171,945 B1 | 1/2001 | Mandal et al. | |
| 6,194,323 B1 | 2/2001 | Downey et al. | |
| 6,201,633 B1 | 3/2001 | Peeters et al. | |
| 6,204,080 B1 | 3/2001 | Hwang | |
| 6,215,221 B1 | 4/2001 | Cabuz et al. | |
| 6,249,039 B1 | 6/2001 | Harvey et al. | |
| 6,275,220 B1 | 8/2001 | Nitta | |
| 6,282,010 B1 | 8/2001 | Sulzbach et al. | |
| 6,288,472 B1 | 9/2001 | Cabuz et al. | |
| 6,288,824 B1 | 9/2001 | Kastalsky et al. | |
| 6,297,072 B1 | 10/2001 | Tilmans et al. | |
| 6,323,982 B1 | 11/2001 | Hornbeck | |
| 6,327,071 B1 | 12/2001 | Kimura et al. | |
| 6,333,556 B1 | 12/2001 | Juengling et al. | |
| 6,340,435 B1 | 1/2002 | Bjorkman et al. | |
| 6,359,673 B1 | 3/2002 | Stephenson | |
| 6,376,787 B1 | 4/2002 | Martin et al. | |
| 6,377,233 B2 | 4/2002 | Colgan et al. | |
| 6,391,675 B1 | 5/2002 | Ehmke et al. | |
| 6,392,781 B1 | 5/2002 | Kim et al. | |
| 6,396,097 B2 | 5/2002 | Joo | |
| 6,407,851 B1 | 6/2002 | Islam et al. | |
| 6,424,094 B1 | 7/2002 | Feldman | |
| 6,436,504 B2 * | 8/2002 | Miyamoto et al. | 428/64.1 |
| 6,447,126 B1 | 9/2002 | Hornbeck | |
| 6,448,622 B1 | 9/2002 | Franke et al. | |
| 6,449,084 B1 | 9/2002 | Guo | |
| 6,452,124 B1 | 9/2002 | York et al. | |
| 6,452,465 B1 | 9/2002 | Brown et al. | |
| 6,465,320 B1 | 10/2002 | McNeil et al. | |
| 6,466,354 B1 | 10/2002 | Gudeman | |
| 6,513,911 B1 | 2/2003 | Ozaki et al. | |
| 6,549,195 B2 | 4/2003 | Hikida et al. | |
| 6,552,840 B2 | 4/2003 | Knipe | |
| 6,574,033 B1 | 6/2003 | Chui et al. | |
| 6,600,201 B2 | 7/2003 | Hartwell et al. | |
| 6,602,791 B2 | 8/2003 | Ouellet et al. | |
| 6,608,268 B1 | 8/2003 | Goldsmith | |
| 6,618,187 B2 | 9/2003 | Pilossof | |
| 6,620,712 B2 | 9/2003 | Huang et al. | |
| 6,624,944 B1 | 9/2003 | Wallace et al. | |
| 6,635,919 B1 | 10/2003 | Melendez et al. | |
| 6,639,724 B2 | 10/2003 | Bower et al. | |
| 6,650,455 B2 | 11/2003 | Miles | |
| 6,653,997 B2 | 11/2003 | Van Gorkom et al. | |
| 6,660,656 B2 | 12/2003 | Cheung et al. | |
| 6,674,090 B1 | 1/2004 | Chua et al. | |
| 6,674,562 B1 | 1/2004 | Miles | |
| 6,713,235 B1 | 3/2004 | Ide et al. | |
| 6,720,267 B1 | 4/2004 | Chen et al. | |
| 6,741,377 B2 | 5/2004 | Miles | |
| 6,747,785 B2 | 6/2004 | Chen et al. | |
| 6,747,800 B1 | 6/2004 | Lin | |
| 6,756,317 B2 | 6/2004 | Sniegowski et al. | |
| 6,778,306 B2 | 8/2004 | Sniegowski et al. | |
| 6,782,166 B1 | 8/2004 | Grote et al. | |
| 6,791,441 B2 | 9/2004 | Pillans et al. | |
| 6,794,119 B2 | 9/2004 | Miles | |
| 6,803,534 B1 | 10/2004 | Chen et al. | |
| 6,806,110 B2 | 10/2004 | Lester et al. | |
| 6,809,788 B2 | 10/2004 | Yamada et al. | |
| 6,812,482 B2 | 11/2004 | Fleming et al. | |
| 6,819,469 B1 | 11/2004 | Koba | |
| 6,844,959 B2 | 1/2005 | Huibers et al. | |
| 6,849,471 B2 | 2/2005 | Patel et al. | |
| 6,855,610 B2 | 2/2005 | Tung et al. | |
| 6,858,080 B2 | 2/2005 | Linares et al. | |
| 6,859,301 B1 | 2/2005 | Islam et al. | |
| 6,861,277 B1 | 3/2005 | Monroe et al. | |
| 6,867,896 B2 | 3/2005 | Miles | |
| 6,870,654 B2 | 3/2005 | Lin et al. | |
| 6,905,613 B2 | 6/2005 | Gutierrez et al. | |
| 6,906,847 B2 | 6/2005 | Huibers et al. | |
| 6,912,022 B2 | 6/2005 | Lin et al. | |
| 6,913,942 B2 | 7/2005 | Patel et al. | |
| 6,940,631 B2 | 9/2005 | Ishikawa | |
| 6,947,200 B2 | 9/2005 | Huibers | |
| 6,951,824 B2 | 10/2005 | Fischer et al. | |
| 6,952,303 B2 | 10/2005 | Lin et al. | |
| 6,953,702 B2 | 10/2005 | Miller et al. | |
| 6,958,847 B2 | 10/2005 | Lin | |
| 6,960,305 B2 | 11/2005 | Doan et al. | |
| 6,972,891 B2 | 12/2005 | Patel et al. | |
| 6,980,350 B2 | 12/2005 | Hung et al. | |
| 6,982,820 B2 | 1/2006 | Tsai | |
| 6,995,890 B2 | 2/2006 | Lin | |
| 6,999,225 B2 | 2/2006 | Lin | |
| 6,999,236 B2 | 2/2006 | Lin | |
| 7,008,812 B1 | 3/2006 | Carley | |
| 7,012,726 B1 | 3/2006 | Miles | |
| 7,016,099 B2 | 3/2006 | Ikeda et al. | |

| Patent | Date | Inventor |
|---|---|---|
| 7,027,202 B1 | 4/2006 | Hunter et al. |
| 7,041,224 B2 | 5/2006 | Patel et al. |
| 7,041,571 B2 | 5/2006 | Strane |
| 7,049,164 B2 | 5/2006 | Bruner |
| 7,078,293 B2 | 7/2006 | Lin et al. |
| 7,102,808 B2 | 9/2006 | Kasai |
| 7,110,158 B2 | 9/2006 | Miles |
| 7,119,945 B2 | 10/2006 | Cummings et al. |
| 7,123,216 B1 | 10/2006 | Miles |
| 7,161,730 B2 | 1/2007 | Floyd |
| 7,172,915 B2 | 2/2007 | Lin et al. |
| 7,198,973 B2 | 4/2007 | Lin et al. |
| 7,221,495 B2 | 5/2007 | Miles et al. |
| 7,250,315 B2 | 7/2007 | Miles |
| 7,256,107 B2 | 8/2007 | Takeuchi et al. |
| 7,291,921 B2 | 11/2007 | Lin |
| 7,297,471 B1 | 11/2007 | Miles |
| 7,321,457 B2 | 1/2008 | Heald |
| 7,323,217 B2 | 1/2008 | Lin et al. |
| 7,327,510 B2 | 2/2008 | Cummings et al. |
| 7,369,292 B2 | 5/2008 | Xu et al. |
| 7,369,296 B2 | 5/2008 | Floyd |
| 7,373,026 B2 | 5/2008 | Chui |
| 7,420,728 B2 | 9/2008 | Tung et al. |
| 7,429,334 B2 | 9/2008 | Tung et al. |
| 7,446,926 B2 | 11/2008 | Sampsell |
| 7,450,295 B2 | 11/2008 | Tung et al. |
| 7,459,402 B2 | 12/2008 | Doan et al. |
| 7,485,236 B2 | 2/2009 | Lin |
| 7,492,502 B2 | 2/2009 | Chui et al. |
| 7,527,996 B2 | 5/2009 | Luo et al. |
| 7,527,998 B2 * | 5/2009 | Tung et al. ............... 438/53 |
| 7,532,386 B2 | 5/2009 | Cummings et al. |
| 7,534,640 B2 | 5/2009 | Sasagawa et al. |
| 7,535,621 B2 | 5/2009 | Chiang |
| 7,547,565 B2 | 6/2009 | Lin et al. |
| 7,547,568 B2 | 6/2009 | Chou et al. |
| 7,550,794 B2 | 6/2009 | Miles et al. |
| 7,556,917 B2 | 7/2009 | Miles |
| 7,561,321 B2 | 7/2009 | Heald |
| 7,564,613 B2 | 7/2009 | Sasagawa et al. |
| 7,566,664 B2 | 7/2009 | Yan et al. |
| 7,567,373 B2 | 7/2009 | Chui et al. |
| 7,580,172 B2 | 8/2009 | Lewis et al. |
| 7,616,369 B2 | 11/2009 | Miles et al. |
| 7,623,287 B2 | 11/2009 | Sasagawa et al. |
| 7,642,110 B2 | 1/2010 | Miles |
| 7,643,203 B2 | 1/2010 | Gousev et al. |
| 7,652,814 B2 | 1/2010 | Zhong et al. |
| 7,660,031 B2 | 2/2010 | Floyd |
| 7,660,058 B2 | 2/2010 | Qiu et al. |
| 7,688,494 B2 | 3/2010 | Xu et al. |
| 7,706,044 B2 | 4/2010 | Lin et al. |
| 7,723,015 B2 | 5/2010 | Miles |
| 7,733,552 B2 | 6/2010 | Londergan et al. |
| 7,763,546 B2 | 7/2010 | Kothari et al. |
| 7,776,631 B2 | 8/2010 | Miles |
| 7,781,850 B2 | 8/2010 | Miles et al. |
| 2001/0003487 A1 | 6/2001 | Miles |
| 2001/0010953 A1 | 8/2001 | Kang et al. |
| 2001/0055208 A1 | 12/2001 | Kimura |
| 2002/0003400 A1 | 1/2002 | Lee |
| 2002/0014579 A1 | 2/2002 | Dunfield |
| 2002/0021485 A1 | 2/2002 | Pilossof |
| 2002/0024292 A1 | 2/2002 | Sakaguchi et al. |
| 2002/0027636 A1 | 3/2002 | Yamada |
| 2002/0036304 A1 | 3/2002 | Ehmke et al. |
| 2002/0055253 A1 | 5/2002 | Rudhard |
| 2002/0058422 A1 | 5/2002 | Jang et al. |
| 2002/0070931 A1 | 6/2002 | Ishikawa |
| 2002/0086455 A1 | 7/2002 | Franosch et al. |
| 2002/0109899 A1 | 8/2002 | Ohtaka et al. |
| 2002/0110948 A1 | 8/2002 | Huang et al. |
| 2002/0117728 A1 | 8/2002 | Brosnihan et al. |
| 2002/0131682 A1 | 9/2002 | Nasiri et al. |
| 2002/0149850 A1 | 10/2002 | Heffner et al. |
| 2002/0167072 A1 | 11/2002 | Andosca |
| 2002/0171610 A1 | 11/2002 | Siwinski et al. |
| 2002/0186209 A1 | 12/2002 | Cok |
| 2002/0195681 A1 | 12/2002 | Melendez et al. |
| 2003/0003682 A1 | 1/2003 | Moll et al. |
| 2003/0003761 A1 | 1/2003 | Yang et al. |
| 2003/0006468 A1 | 1/2003 | Ma et al. |
| 2003/0007107 A1 | 1/2003 | Chae |
| 2003/0021004 A1 | 1/2003 | Cunningham et al. |
| 2003/0029831 A1 | 2/2003 | Kawase |
| 2003/0047533 A1 | 3/2003 | Reid et al. |
| 2003/0053078 A1 | 3/2003 | Missey et al. |
| 2003/0071015 A1 | 4/2003 | Chinn et al. |
| 2003/0072070 A1 | 4/2003 | Miles |
| 2003/0077843 A1 | 4/2003 | Yamauchi et al. |
| 2003/0102771 A1 | 6/2003 | Akiba et al. |
| 2003/0118920 A1 | 6/2003 | Johnstone et al. |
| 2003/0132822 A1 | 7/2003 | Ko et al. |
| 2003/0138986 A1 | 7/2003 | Bruner |
| 2003/0164350 A1 | 9/2003 | Hanson et al. |
| 2003/0202264 A1 | 10/2003 | Weber et al. |
| 2003/0202265 A1 | 10/2003 | Reboa et al. |
| 2004/0028849 A1 | 2/2004 | Stark et al. |
| 2004/0035821 A1 | 2/2004 | Doan et al. |
| 2004/0038513 A1 | 2/2004 | Kohl et al. |
| 2004/0053434 A1 | 3/2004 | Bruner |
| 2004/0058531 A1 | 3/2004 | Hsieh et al. |
| 2004/0058532 A1 | 3/2004 | Miles et al. |
| 2004/0061543 A1 | 4/2004 | Nam et al. |
| 2004/0080035 A1 | 4/2004 | Delapierre |
| 2004/0080832 A1 | 4/2004 | Singh |
| 2004/0100594 A1 | 5/2004 | Huibers et al. |
| 2004/0124073 A1 | 7/2004 | Pillans et al. |
| 2004/0124483 A1 | 7/2004 | Partridge et al. |
| 2004/0124495 A1 | 7/2004 | Chen et al. |
| 2004/0125281 A1 | 7/2004 | Lin et al. |
| 2004/0125282 A1 | 7/2004 | Lin et al. |
| 2004/0125536 A1 | 7/2004 | Arney et al. |
| 2004/0132243 A1 | 7/2004 | Kurosawa et al. |
| 2004/0136076 A1 | 7/2004 | Tayebati |
| 2004/0150869 A1 | 8/2004 | Kasai |
| 2004/0150939 A1 | 8/2004 | Huff |
| 2004/0159629 A1 | 8/2004 | Busta |
| 2004/0175577 A1 | 9/2004 | Lin et al. |
| 2004/0191937 A1 | 9/2004 | Patel et al. |
| 2004/0191946 A1 | 9/2004 | Patel et al. |
| 2004/0197526 A1 | 10/2004 | Mehta |
| 2004/0207898 A1 | 10/2004 | Lin et al. |
| 2004/0209195 A1 | 10/2004 | Lin |
| 2004/0217264 A1 | 11/2004 | Wood et al. |
| 2004/0217919 A1 | 11/2004 | Piehl et al. |
| 2004/0244191 A1 | 12/2004 | Orr et al. |
| 2005/0012577 A1 | 1/2005 | Pillans et al. |
| 2005/0012975 A1 | 1/2005 | George et al. |
| 2005/0014374 A1 | 1/2005 | Partridge et al. |
| 2005/0020089 A1 | 1/2005 | Shi et al. |
| 2005/0024557 A1 | 2/2005 | Lin |
| 2005/0034822 A1 | 2/2005 | Kim et al. |
| 2005/0035699 A1 | 2/2005 | Tsai |
| 2005/0045276 A1 | 3/2005 | Patel et al. |
| 2005/0046919 A1 | 3/2005 | Taguchi et al. |
| 2005/0046922 A1 | 3/2005 | Lin et al. |
| 2005/0078348 A1 | 4/2005 | Lin |
| 2005/0098840 A1 | 5/2005 | Fuertsch et al. |
| 2005/0118832 A1 | 6/2005 | Korzenski et al. |
| 2005/0124135 A1 | 6/2005 | Ayazi et al. |
| 2005/0128565 A1 | 6/2005 | Ljungblad |
| 2005/0170670 A1 | 8/2005 | King et al. |
| 2005/0195462 A1 | 9/2005 | Lin |
| 2005/0249966 A1 | 11/2005 | Tung et al. |
| 2005/0250235 A1 | 11/2005 | Miles et al. |
| 2005/0253820 A1 | 11/2005 | Horiuchi |
| 2005/0266599 A1 | 12/2005 | Ikegami |
| 2006/0024880 A1 | 2/2006 | Chui et al. |
| 2006/0050393 A1 | 3/2006 | Lin et al. |
| 2006/0056001 A1 | 3/2006 | Taguchi et al. |
| 2006/0066511 A1 | 3/2006 | Chui |
| 2006/0066932 A1 | 3/2006 | Chui |
| 2006/0066935 A1 | 3/2006 | Cummings et al. |
| 2006/0067646 A1 | 3/2006 | Chui |
| 2006/0076311 A1 | 4/2006 | Tung et al. |
| 2006/0077502 A1 | 4/2006 | Tung et al. |

| | | |
|---|---|---|
| 2006/0077503 A1 | 4/2006 | Palmateer et al. |
| 2006/0077528 A1 | 4/2006 | Floyd |
| 2006/0077529 A1 | 4/2006 | Chui et al. |
| 2006/0119922 A1 | 6/2006 | Faase et al. |
| 2006/0177950 A1 | 8/2006 | Lin et al. |
| 2006/0209386 A1 | 9/2006 | Sudak et al. |
| 2006/0234412 A1 | 10/2006 | Lazaroff |
| 2006/0256420 A1 | 11/2006 | Miles et al. |
| 2006/0257070 A1 | 11/2006 | Lin et al. |
| 2006/0261330 A1 | 11/2006 | Miles |
| 2006/0281212 A1 | 12/2006 | Moriceau et al. |
| 2007/0004080 A1 | 1/2007 | Ouyang |
| 2007/0103028 A1 | 5/2007 | Lewis et al. |
| 2007/0111533 A1 | 5/2007 | Korzenski et al. |
| 2007/0121205 A1 | 5/2007 | Miles |
| 2007/0155051 A1 | 7/2007 | Wang et al. |
| 2007/0170540 A1 | 7/2007 | Chung et al. |
| 2007/0196944 A1 | 8/2007 | Chou et al. |
| 2007/0206267 A1 | 9/2007 | Tung et al. |
| 2007/0236774 A1 | 10/2007 | Gousev et al. |
| 2007/0249078 A1 | 10/2007 | Tung et al. |
| 2007/0249079 A1 | 10/2007 | Sasagawa et al. |
| 2007/0249081 A1 | 10/2007 | Luo et al. |
| 2007/0269748 A1 | 11/2007 | Miles |
| 2007/0285761 A1 | 12/2007 | Zhong et al. |
| 2008/0003784 A1 | 1/2008 | Pan |
| 2008/0026328 A1 | 1/2008 | Miles |
| 2008/0029481 A1 | 2/2008 | Kothari et al. |
| 2008/0030825 A1 | 2/2008 | Sasagawa et al. |
| 2008/0032439 A1 | 2/2008 | Yan et al. |
| 2008/0068699 A1 | 3/2008 | Miles |
| 2008/0093688 A1 | 4/2008 | Cummings et al. |
| 2008/0094687 A1 | 4/2008 | Heald |
| 2008/0130089 A1 | 6/2008 | Miles |
| 2008/0144163 A1 | 6/2008 | Floyd |
| 2008/0158635 A1 | 7/2008 | Hagood et al. |
| 2008/0158645 A1 | 7/2008 | Chiang |
| 2008/0218840 A1 | 9/2008 | Qui et al. |
| 2008/0226929 A1 | 9/2008 | Chung et al. |
| 2008/0239449 A1 | 10/2008 | Xu et al. |
| 2009/0022884 A1 | 1/2009 | Chui et al. |
| 2009/0315567 A1 | 12/2009 | Chou et al. |
| 2009/0323168 A1 | 12/2009 | Miles et al. |
| 2010/0079849 A1 | 4/2010 | Floyd |
| 2010/0128339 A1 | 5/2010 | Gousev et al. |
| 2010/0129025 A1 | 5/2010 | Chui |
| 2010/0147790 A1 | 6/2010 | Sasagawa et al. |
| 2010/0149627 A1 | 6/2010 | Sasagawa et al. |

FOREIGN PATENT DOCUMENTS

| | | |
|---|---|---|
| DE | 199 38 072 | 3/2000 |
| EP | 0 035 299 | 9/1983 |
| EP | 0 667 548 | 8/1995 |
| EP | 0 788 005 | 8/1997 |
| EP | 1 170 618 | 1/2002 |
| EP | 1 209 738 | 5/2002 |
| EP | 1 243 550 | 9/2002 |
| EP | 1 452 481 | 9/2004 |
| EP | 1640772 | 3/2006 |
| JP | 49-004993 | 1/1974 |
| JP | 05275401 | 10/1993 |
| JP | 06-281956 | 10/1994 |
| JP | 06-350105 | 12/1994 |
| JP | 07-45550 | 2/1995 |
| JP | 07-098326 | 4/1995 |
| JP | 07-060844 | 7/1995 |
| JP | 09-036387 | 2/1997 |
| JP | 10-020328 | 1/1998 |
| JP | 10-116996 | 5/1998 |
| JP | 10-148644 | 6/1998 |
| JP | 10-209176 | 8/1998 |
| JP | 11-243214 | 9/1999 |
| JP | 11-263012 | 9/1999 |
| JP | 2000-40831 | 2/2000 |
| JP | 2001-085519 | 3/2001 |
| JP | 2002-287047 | 3/2001 |
| JP | 2002-207182 | 7/2002 |
| JP | 2002-243937 | 8/2002 |
| JP | 2002-296521 | 10/2002 |
| JP | 2002-328313 | 11/2002 |
| JP | 2002-341267 | 11/2002 |
| JP | 2003-001598 | 1/2003 |
| JP | 2003-057571 | 2/2003 |
| JP | 2003195201 | 7/2003 |
| JP | 2004-53852 | 2/2004 |
| JP | 2004-106074 | 4/2004 |
| JP | 2004-133281 | 4/2004 |
| JP | 2005-051007 | 2/2005 |
| JP | 2005-193336 | 7/2005 |
| KR | 2002-9270 | 10/1999 |
| TW | 157313 | 5/1991 |
| WO | WO 91/05284 | 4/1991 |
| WO | WO 92/10925 | 6/1992 |
| WO | WO 97/17628 | 5/1997 |
| WO | WO 98/29748 | 7/1998 |
| WO | WO 99/34484 | 7/1999 |
| WO | WO 01/14248 | 3/2001 |
| WO | WO 01/63657 | 8/2001 |
| WO | WO 02/24570 | 3/2002 |
| WO | WO 03/046508 | 6/2003 |
| WO | WO 2004/000717 | 12/2003 |
| WO | WO 2004/015741 | 2/2004 |
| WO | WO 2004/055885 | 7/2004 |
| WO | WO 2004/079056 | 9/2004 |
| WO | WO 2004/087561 | 10/2004 |
| WO | WO 2005/061378 | 7/2005 |
| WO | WO 2005/066596 | 7/2005 |
| WO | WO 2005/124869 | 12/2005 |
| WO | WO 2006/091860 | 8/2006 |
| WO | WO 2006/113492 | 10/2006 |
| WO | WO 2008/046682 | 4/2008 |

OTHER PUBLICATIONS

Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.

Chu, et al. "Formation and Microstructures of Anodic Aluminoa Films from Aluminum Sputtered onglass Substrate" Journal of the Electrochemical Society, 149 (7) B321-B327 (2002).

Crouse, "Self-ordered pore structure of anodized aluminum on silicon and pattern transfer" Applied Physics Letters, vol. 76, No. 1, Jan. 3, 2000. pp. 49-51.

Feb. 23, 2009 International Search Report and Written Opinion in PCT application No. PCT/US2008/056310.

French, P.J. "Development of Surface Micromachining techniques compatable with on-chip electronics" Journal of Micromechanics and Microengineering vol. 6 No. 2, 197-211 XP 002360789 Jun. 1996 IOP Publishing.

Furneaux, et al. "The Formation of Controlled-porosity membranes from Anodically Oxidized Aluminium" Nature vo 337 Jan. 12, 1989, pp. 147-149.

Goossen et al., "Possible Display Applications of the Silicon Mechanical Anti-Reflection Switch," Society for Information Display (1994).

Hall, Integrated optical inteferometric detection method for micromachined capacitiive acoustic transducers, App. Phy. Let. 80:20(3859-3961) May 20, 2002.

Hoivik et al. 2002. Atomic layer deposition (ALD) technology for reliable RF MEMS, IEEE, pp. 1229-1232.

Hoivik et al. 2002. Atomic layer deposition of conformal dielectric and protective coatings for released micro-electromechanical devices, IEEE, pp. 455-458.

Ibbotson et al., "Comparison of XeF2 and F-atom reactions with Si and SiO2," Applied Physics Letters, vol. 44, No. 12, pp. 1129-1131 (Jun. 1984).

IPRP for PCT/US08/056310, filed Feb. 23, 2009.

Kawamura et al., Fabrication of fine metal microstructures packaged in the bonded glass substrates, Proceedings of SPIE, vol. 3893, pp. 486-493, 1999.

Kim et al., "Control of Optical Transmission Through Metals Perforated With Subwavelength Hole Arrays," Optic Letters, vol. 24, No. 4, pp. 256-257, (Feb. 1999).

Matsumoto et al., Novel prevention method of stiction using silicon anodization for SOI structure, Sensors and Actuators, 72:2(153-159) Jan. 19, 1999.

Raley et al., "A Fabry-Perot Microinterferometer for Visible Wavelengths," IEEE Solid-State Sensor and Actuator Workshop, Hilton Head, SC, pp. 170-173 (1992).

Sridharan et al. "Post-packaging Release a New Concept for Surface-Micromachined Devices" Technical Digest, IEEE Solid-State Sensor & Actuator Workshop, New York, NY US Nov. 8, 1998 pp. 225-228.

Watanabe et al., Reduction of microtrenching and island formation in oxide plasma etching by employing electron beam charge neutralization, Applied Physics Letters, 79:17(2698-2700), Oct. 22, 2001.

Williams, et al. Etch Rates for Micromachining Processing. Journal of Microelectromechanical Systems, vol. 5, No. 4, pp. 256-259, (Dec. 1996).

Winters, et al. The etching of silicon with $XeF_2$ vapor. Applied Physics Letters, vol. 34, No. 1, pp. 70-73, (Jan. 1979).

Yao et al., $BrF_3$ dry release technology for large freestanding parylene microstructures and electrostatic actuators, Sensors and Actuators A, vol. 97-98, pp. 771-775, Apr. 2002.

Xactix Xetch X# Specifications, http:--www.xactix.com-XtechX3specs.htm, Jan. 5, 2005.

ISR and WO for PCT/US08/056310, filed Feb. 23, 2009.

Boucinha et al., 2000, Amorphous silicon air-gap resonators on large-area substrates, Applied Physics Letters, 77(6):907-909.

Chung et al., 2005, Fabrication and characterization of amorphous Si films by PECVD for MEMS, J. Micromech. Microeng. 15:136-142.

Rusu et al., 2001, Planarization of deep trenches, Proc. SPIE, 4557:49-57.

Office Action dated May 1, 2009 in U.S. Appl. No. 11/689,430.

Office Action dated Oct. 29, 2009 in U.S. Appl. No. 11/689,430.

Notice of Reasons for Rejection dated Jul. 27, 2011 in Japanese App. No. 2009-554632.

* cited by examiner

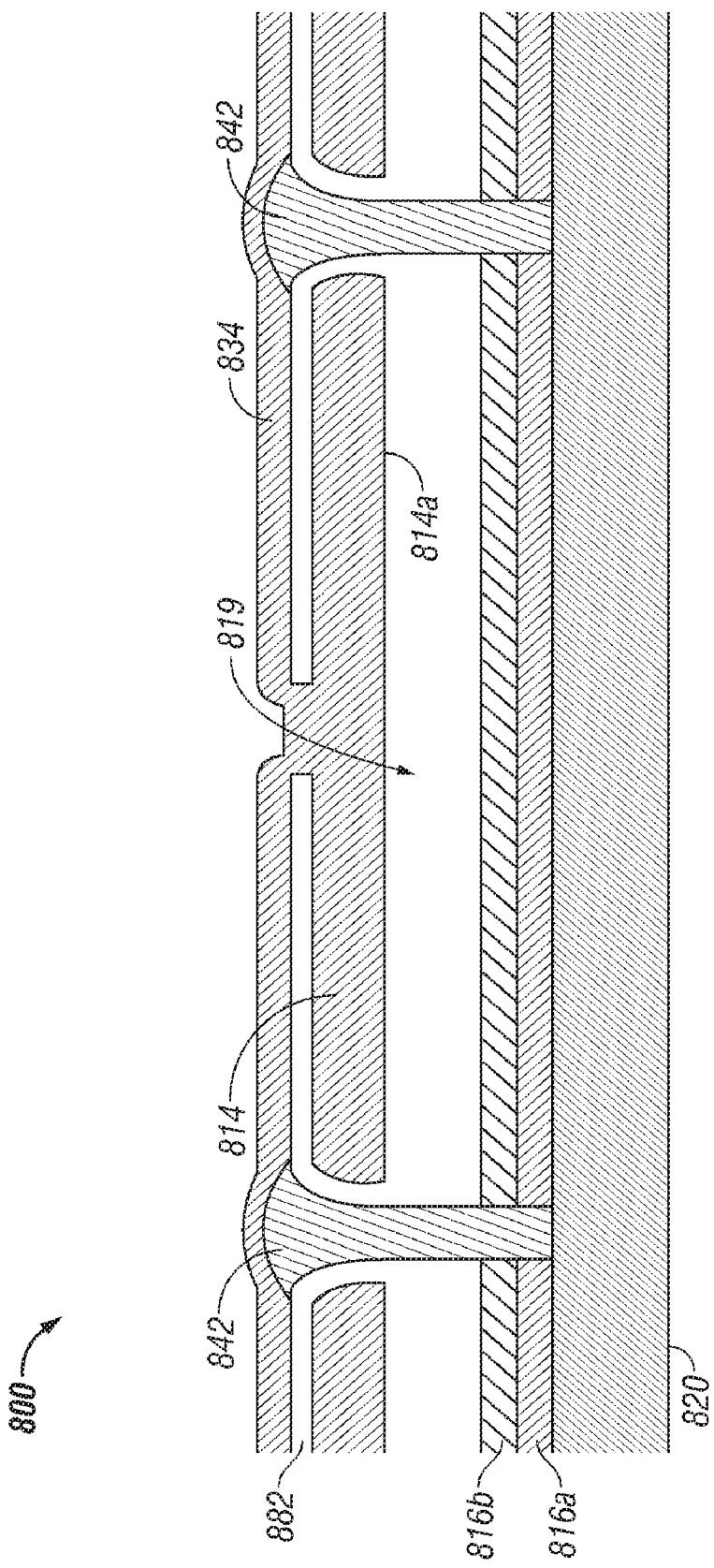

MEMS CAVITY-COATING LAYERS AND METHODS

REFERENCE TO RELATED APPLICATIONS

The application is a divisional of U.S. application Ser. No. 11/689,430, filed Mar. 21, 2007, which is hereby incorporated by reference in its entirety.

BACKGROUND OF THE INVENTION

1. Technical Field

This application is generally related to microelectromechanical systems (MEMS), and more particularly, to coatings within MEMS cavities and methods for forming the same.

2. Description of the Related Art

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

Devices, methods, and systems comprising a MEMS device, for example, an interferometric modulator, that comprises a cavity in which a layer coats multiple surfaces. The layer is conformal or non-conformal. In some embodiments, the layer is formed by atomic layer deposition (ALD). Preferably, the layer comprises a dielectric material. In some embodiments, the MEMS device also exhibits improved characteristics, such as improved electrical insulation between moving electrodes, reduced stiction, and/or improved mechanical properties.

Accordingly, some embodiments provide a method for forming an interferometric modulator and/or an interferometric modulator formed by the method, the method comprising: forming a cavity in an interferometric modulator; and forming at least part of the optical dielectric layer within the cavity after forming the cavity. The cavity is defined by a first layer and a second layer, and the second layer is movable relative to the first layer.

In some embodiments, forming at least part of the optical dielectric layer comprises forming at least part of an optical oxide layer by atomic layer deposition. In some embodiments, forming at least part of the optical dielectric layer comprises forming at least one of $Al_2O_3$ and $SiO_2$. In some embodiments, forming at least part of the optical dielectric layer comprises forming a plurality of sub-layers. In some embodiments, forming at least part of the optical dielectric layer comprises forming at least part of the optical oxide layer at a temperature of less than about 350° C. In some embodiments, forming at least part of the optical dielectric layer by atomic layer deposition comprises forming a first conformal layer of an optical oxide material within the cavity. In some embodiments, a thickness of the first conformal layer formed over a portion of the first layer defining the cavity is substantially equal to a thickness of the first conformal layer formed over a portion of the second layer defining the cavity. In some embodiments, wherein a thickness of the first conformal layer formed over a portion of the first layer defining the cavity is from about 50 Å to about 400 Å. In some embodiments, forming at least part of the optical dielectric layer by atomic layer deposition comprises forming a non-conformal layer of an optical oxide material over at least a portion of the first layer.

Some embodiments further comprise forming a layer of an optical dielectric material on a surface of the second layer after forming the cavity, wherein the surface of the second layer is outside of the cavity.

In some embodiments, the first layer defining the cavity comprises a dielectric material. In some embodiments, forming at least part of dielectric layer by atomic layer deposition comprises sealing at least one pinhole in the dielectric material. In some embodiments, a total thicknesses of an optical dielectric system, which includes two layers of the at least part of dielectric layer and the dielectric material, is less than about 100 nm.

In some embodiments, forming at least part of dielectric layer by atomic layer deposition comprises forming at least part of an optical oxide layer over a manufacturing residue disposed on the first layer.

Some embodiments further comprise packaging the interferometric modulator before forming at least part of the optical dielectric layer by a method comprising: forming a seal circumscribing the interferometric modulator, wherein the seal comprises at least one opening; and securing a backplate to the seal, thereby packaging the interferometric modulator. Some embodiments further comprise filling the at least one opening in the seal after forming at least part of an optical dielectric layer.

Other embodiments provide an interferometric modulator comprising: a first layer comprising a partial reflector; a reflective layer movable relative to the first layer; a cavity defined by the first layer and the reflective layer; and a conformal dielectric layer formed within the cavity over the first layer and the reflective layer.

Some embodiments further comprise a deformable layer coupled to the reflective layer.

In some embodiments, the conformal dielectric layer comprises at least one of $SiO_2$ and $Al_2O_3$. In some embodiments, thickness of the conformal dielectric layer is at least about 10 Å. In some embodiments, thickness of the conformal dielectric layer is from about 50 Å to about 400 Å.

Some embodiments further comprise a primary dielectric layer formed over the first layer.

Other embodiments provide a display comprising an array interferometric modulators comprising: a first layer comprising a partial reflector; a reflective layer movable relative to the first layer; a cavity defined by the first layer and the reflective layer; and a conformal dielectric layer formed within the cavity over the first layer and the reflective layer, the display further comprising: a seal circumscribing the interferometric modulator; and a backplate secured to the seal.

Other embodiments provide an apparatus comprising: a display comprising an array interferometric modulators comprising: a first layer comprising a partial reflector; a reflective layer movable relative to the first layer; a cavity defined by the first layer and the reflective layer; and a conformal dielectric layer formed within the cavity over the first layer and the reflective layer, the display further comprising: a seal circumscribing the interferometric modulator; and a backplate secured to the seal; a processor that is configured to communicate with said display, said processor being configured to process image data; and a memory device that is configured to communicate with said processor.

Some embodiments further comprise a driver circuit configured to send at least one signal to the display. Some embodiments further comprise a controller configured to send at least a portion of the image data to the driver circuit. Some embodiments further comprise an image source module configured to send said image data to said processor. In some embodiments, the image source module comprises at least one of a receiver, transceiver, and transmitter. Some embodiments further comprise an input device configured to receive input data and to communicate said input data to said processor.

Other embodiments provide an interferometric modulator comprising: a means for partially reflecting light; a movable means for actuating the interferometric modulator and for reflecting light; and a dielectric means for covering the means for partially reflecting light and the movable means.

Other embodiments provide a microelectromechanical systems device comprising: a substrate comprising a first face; a deformable layer comprising a first face and a second face; a variably-sized cavity comprising opposite faces defined by the first face of the substrate and the first face of the deformable layer; a plurality of openings in the deformable layer; a plurality of locations on the first face of the substrate opposite from the openings in the deformable layer; and a dielectric layer in the cavity formed over the first face of the substrate and the first face of the deformable layer, and at least a portion of the second face of the deformable layer.

In some embodiments, the dielectric layer is thicker over the plurality of locations on the first face of the substrate opposite from the openings in the deformable layer than over another location on the first face of the substrate. In some embodiments, the dielectric layer is substantially conformal over all surfaces within the cavity.

Some embodiments further comprise a movable conductor disposed in the cavity and secured to the deformable layer, wherein the movable conductor comprises a surface proximal to the substrate, and a portion of the dielectric layer is formed over the surface of the movable conductor proximal to the substrate.

Other embodiments provide a method for manufacturing a microelectromechanical systems device and/or a microelectromechanical systems device manufactured by the method, the method comprising: forming a sacrificial layer over a first electrode; forming a deformable layer over the sacrificial layer; forming a plurality of openings in the deformable layer; removing the sacrificial layer through at least some of the plurality of openings in the deformable layer, thereby forming a cavity between the first electrode and the deformable layer; and depositing a layer in the cavity by atomic layer deposition after removing the sacrificial layer.

In some embodiments, depositing a layer in the cavity by atomic layer deposition comprises depositing a layer comprising at least one of $Al_2O_3$ and $SiO_2$. In some embodiments, depositing a layer in the cavity by atomic layer deposition comprises depositing a conformal layer. In some embodiments, depositing a layer in the cavity by atomic layer deposition comprises depositing a non-conformal layer.

Other embodiments provide a method for manufacturing a microelectromechanical systems device and/or a microelectromechanical systems device manufactured by the method, the method comprising: forming a sacrificial layer over a first layer comprising a partial reflector; forming a movable reflective layer over the sacrificial layer; etching away the sacrificial layer, thereby forming an optical interference cavity comprising opposite sides defined by the first layer and the movable mirror; and depositing a layer in the cavity by atomic layer deposition.

In some embodiments, etching away the sacrificial layer comprises contacting the sacrificial layer with $XeF_2$.

In some embodiments, forming a sacrificial layer comprises forming a layer comprising at least one of molybdenum, germanium, amorphous silicon. In some embodiments, forming a sacrificial layer comprises forming a layer comprising a plurality of sublayers.

Some embodiments further comprise: forming a seal comprising at least one opening on the first layer circumscribing the movable reflective layer; and securing a backplate to the seal, wherein the forming a seal and securing a backplate are performed before depositing a layer in the cavity.

Other embodiments provide a method for reducing stiction in a microelectromechanical systems device and a microelectromechanical systems device manufactured by the method, the method comprising: defining a cavity in a microelectromechanical systems device between a first layer and a second layer, wherein the second layer is movable relative to the first layer; and forming by atomic layer deposition a stiction-reducing layer within the cavity after defining the cavity.

Other embodiments provide forming by atomic layer deposition a stiction-reducing layer comprises forming by atomic layer deposition a stiction-reducing layer comprising at least one of $Al_2O_3$ and $SiO_2$. Other embodiments provide forming by atomic layer deposition a stiction-reducing layer comprises forming by atomic layer deposition a conformal layer.

Other embodiments provide a method for reducing stiction in a microelectromechanical systems device and a microelectromechanical systems device manufactured by the method, the method comprising: defining a cavity for the microelectromechanical systems device between a first layer and a second layer, wherein the second layer is movable relative to the first layer; and forming a layer by atomic layer deposition within the cavity after defining the cavity.

In some embodiments, the microelectromechanical systems device is an element of an array of microelectromechanical systems devices.

Some embodiments further comprise forming a plurality of openings in the second layer.

BRIEF DESCRIPTION OF THE DRAWINGS

FIGS. 8B-8E illustrate cross sections of intermediate structures of an embodiment of a method for manufacturing the interferometric modulator illustrated in FIG. 8A.

DETAILED DESCRIPTION OF SOME PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments described herein include methods of lining MEMS cavities by atomic layer deposition (ALD) after removal of sacrificial material. The deposited material can conformally coat all cavity surfaces, serving as an optical dielectric layer, or serving as a supplemental dielectric that seals pin holes in a previously formed dielectric, in either case resulting in a thinner dielectric for a given insulation quality. Materials can be chosen to exhibit combinations of reduced stiction between relatively moving electrodes, reduced surface charge build-up, improved mechanical properties, and/or improved electrical properties. In another embodiment, ALD conditions are selected to deposit a nonconformal layer preferentially in regions proximate openings into the cavity, thereby reducing contact area and thus stiction when the MEMS electrodes are actuated to collapse the cavity. Removal of sacrificial material and subsequent ALD coating can be performed before or after assembly of the MEMS substrate with a backplate.

Figure 1:
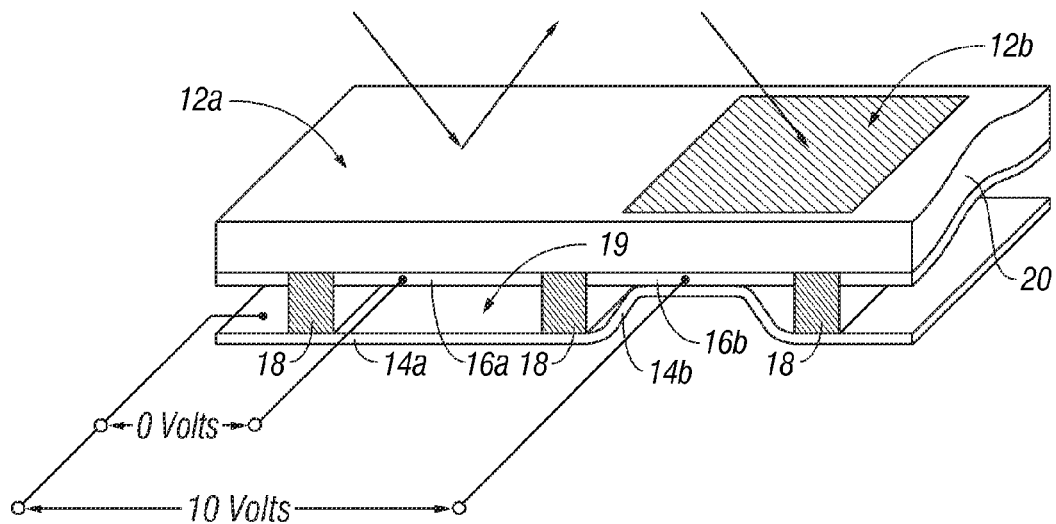
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in FIG. 1) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
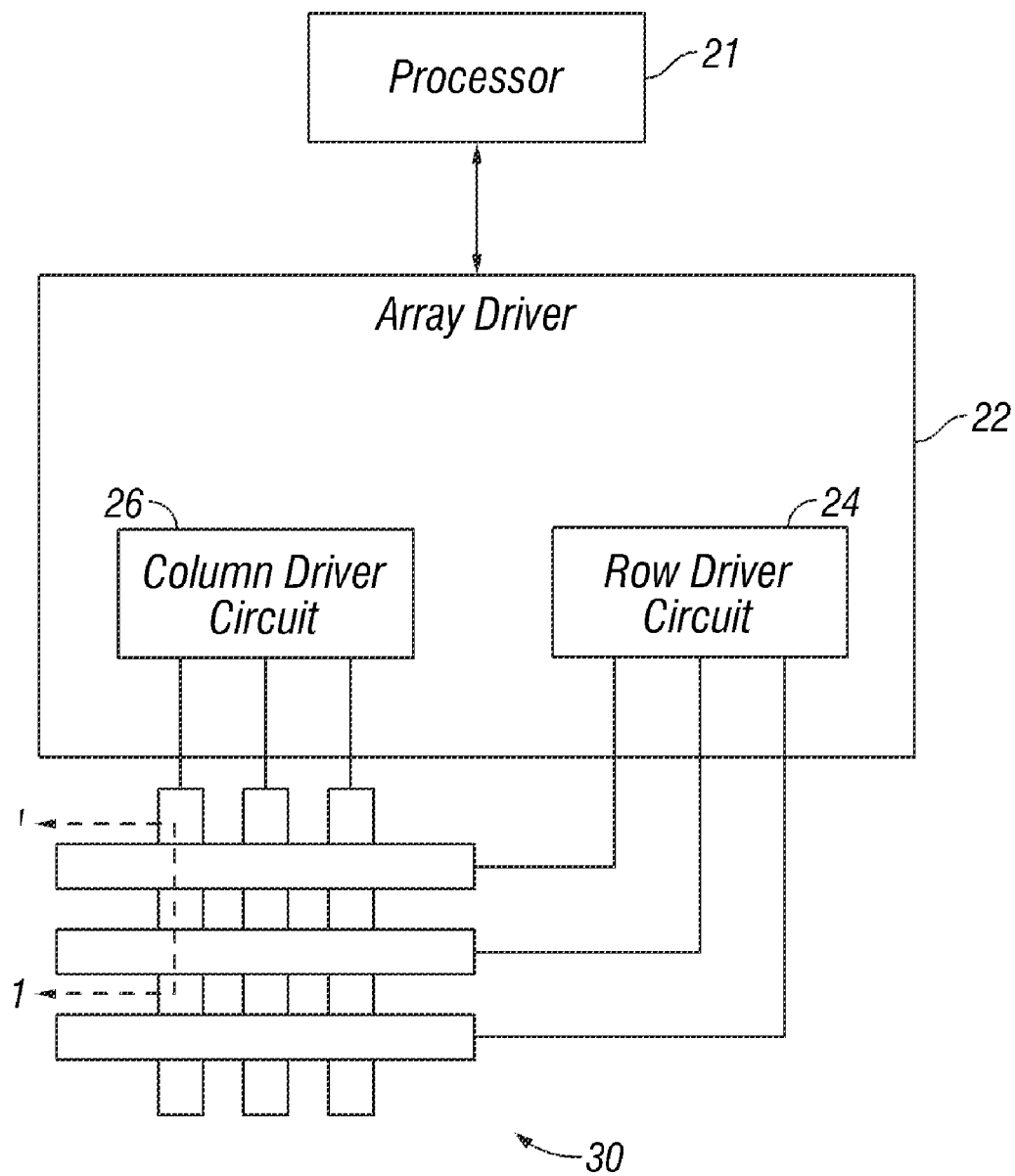
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
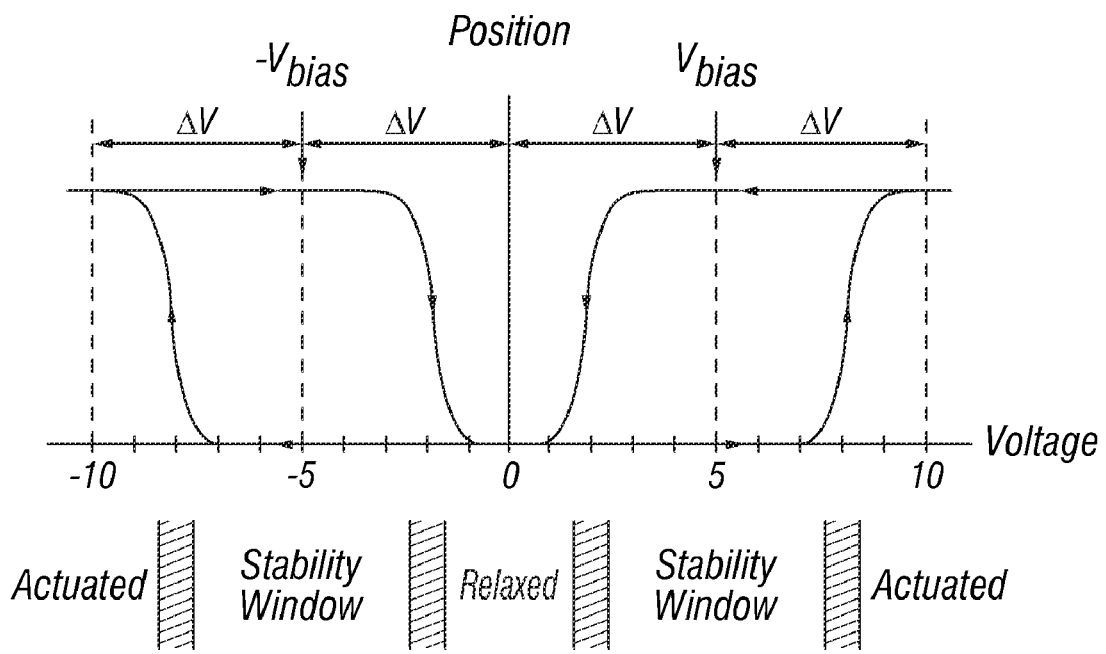
FIG. 3 is a diagram of movable minor position versus applied voltage for one exemplary embodiment of an interferometric modulator of FIG. 1.
FIG. 4 is an illustration of a set of row and column voltages that may be used to drive an interferometric modulator display.
Figure 5A:
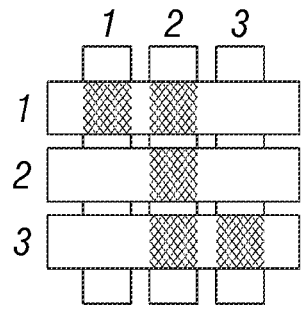
FIG. 5A illustrates one exemplary frame of display data in the 3×3 interferometric modulator display of FIG. 2.
Figure 5B:
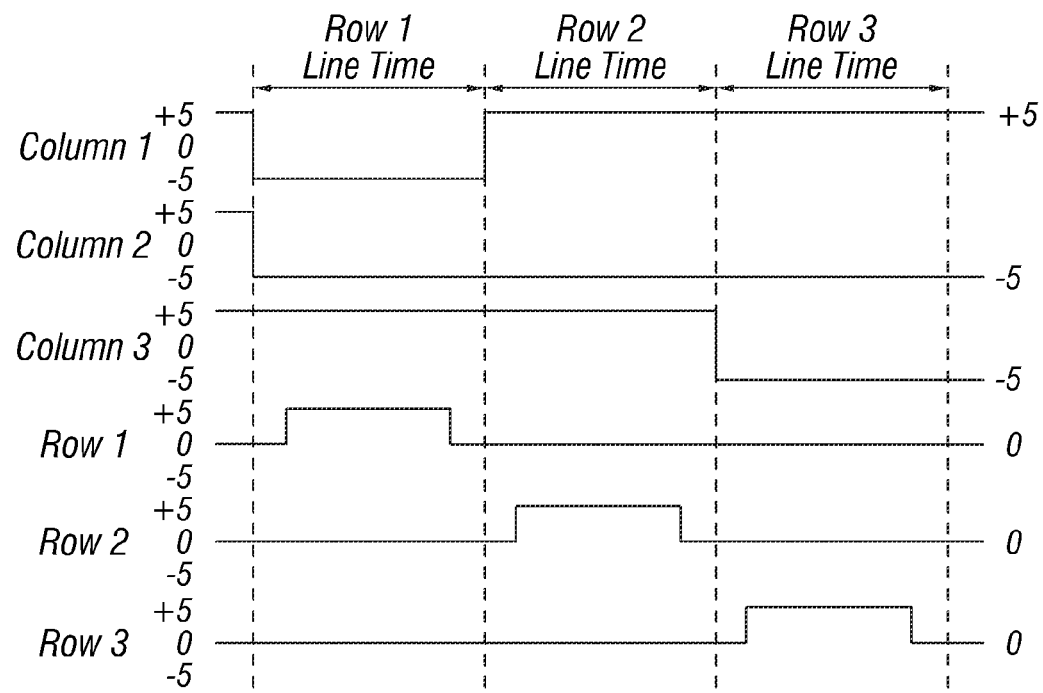
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
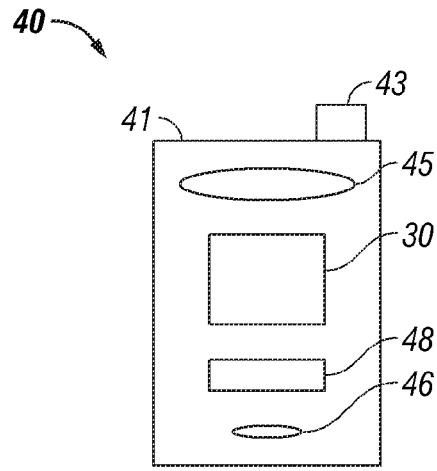
FIGS. 6A and 6B are system block diagrams illustrating an embodiment of a visual display device comprising a plurality of interferometric modulators.
Figure 6B:
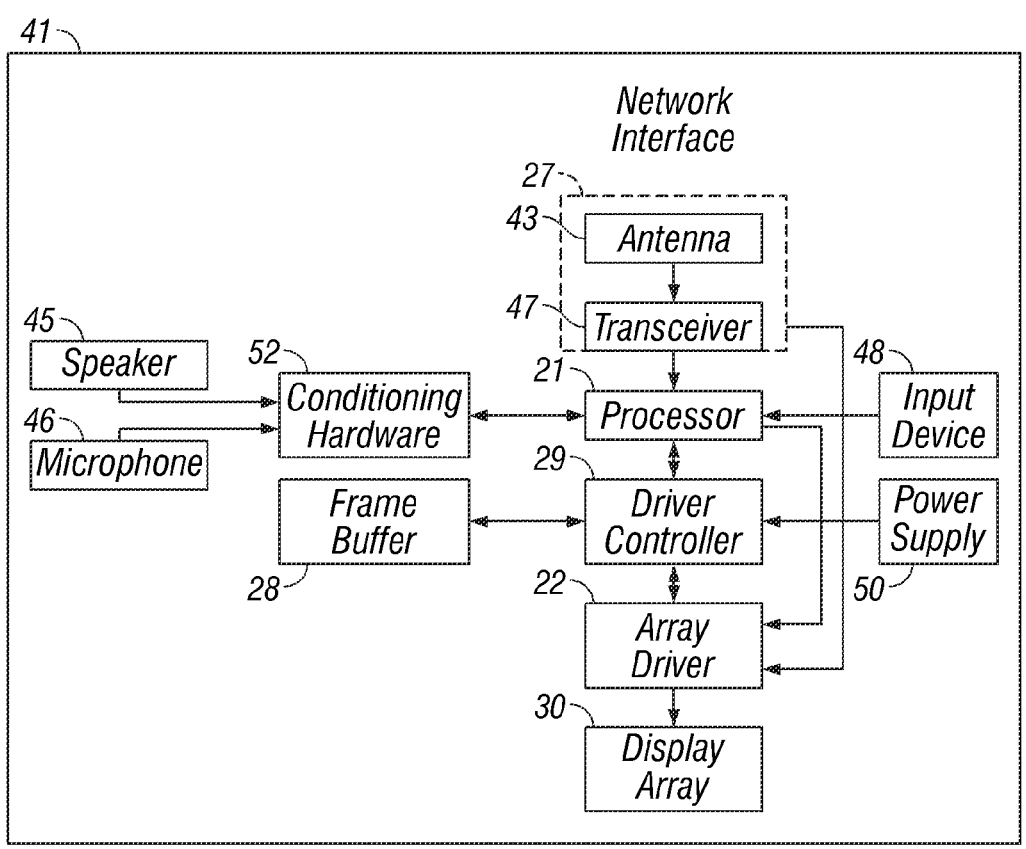

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
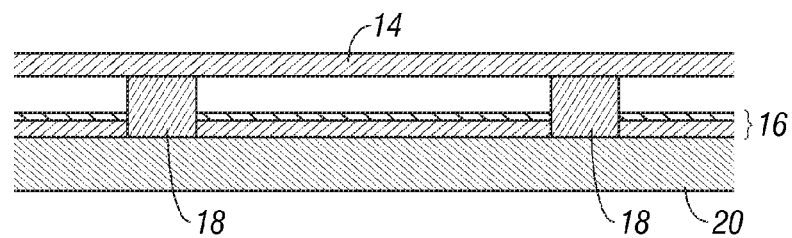
FIG. 7A is a cross section of the device of FIG. 1.
Figure 7B:
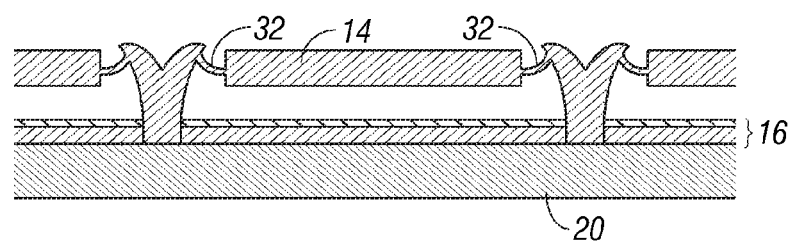
FIG. 7B is a cross section of an alternative embodiment of an interferometric modulator.
Figure 7C:
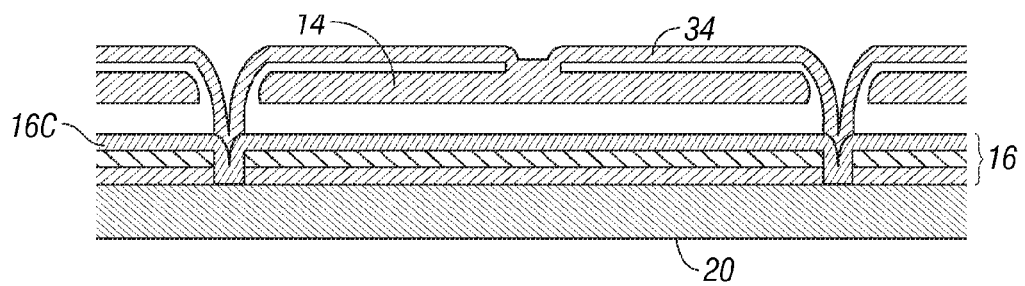
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections can take the form of continuous walls and/or individual posts. For example, parallel rails can support crossing rows of deformable layer 34 materials, thus defining columns of pixels in trenches and/or cavities between the rails. Additional support posts within each cavity can serve to stiffen the deformable layer 34 and prevent sagging in the relaxed position.

Figure 7D:
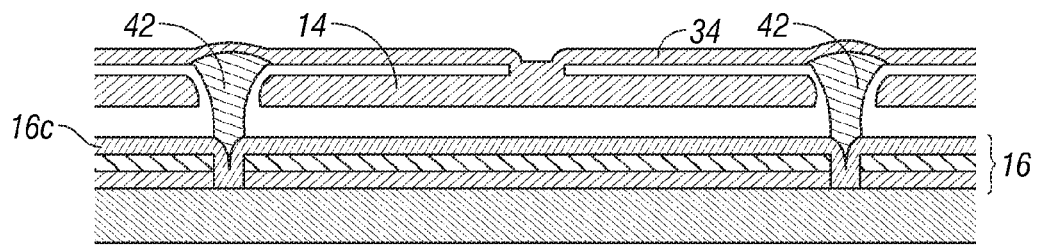
FIG. 7D is a cross section of yet another alternative embodiment of an interferometric modulator.
Figure 7E:
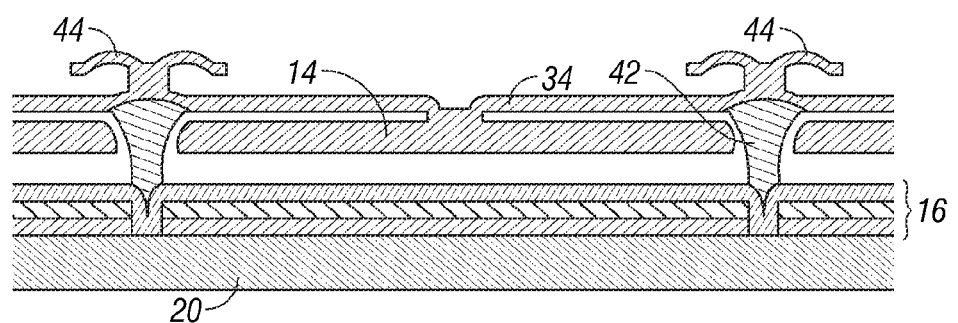
FIG. 7E is a cross section of an additional alternative embodiment of an interferometric modulator.

The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIGS. 7A-7E, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8A:
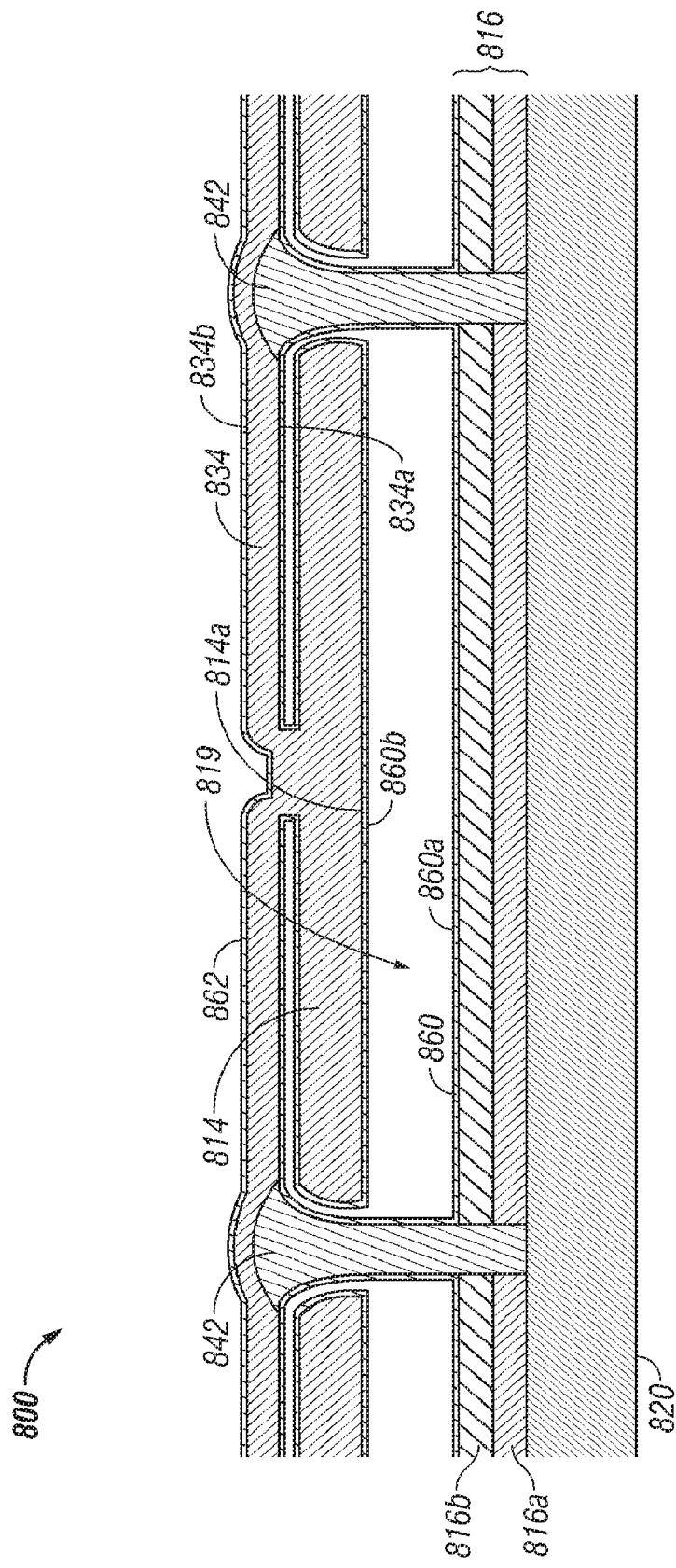
FIG. 8A illustrates a cross section of an embodiment of an interferometric modulator comprising a conformal dielectric layer formed in a cavity thereof and over the moving electrode.
Figure 8B:
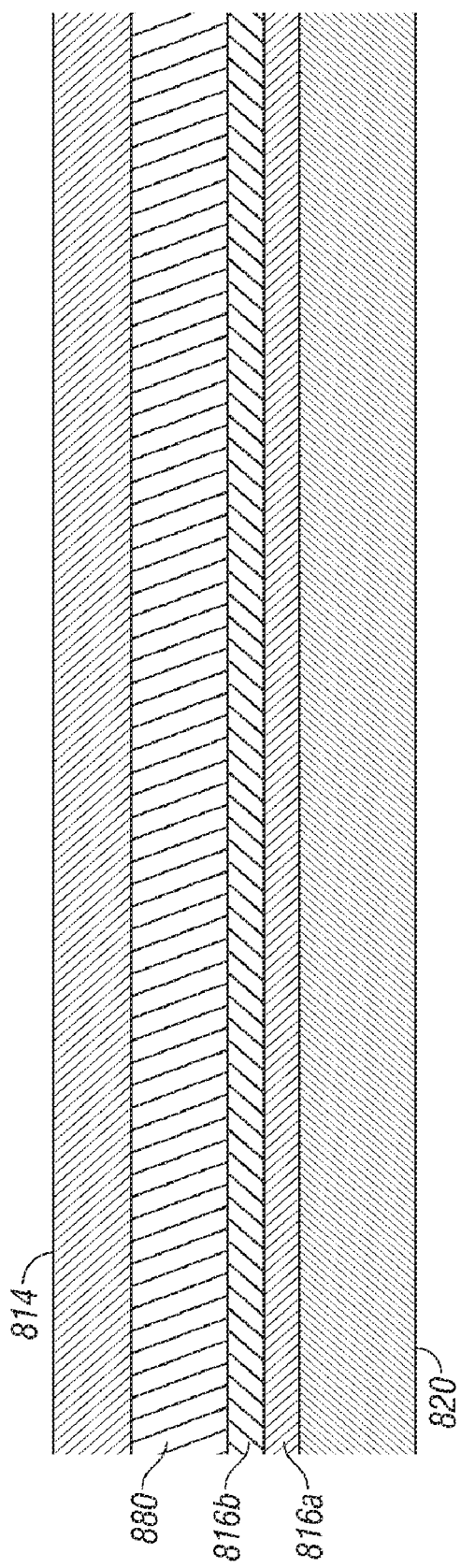
Figure 8C:
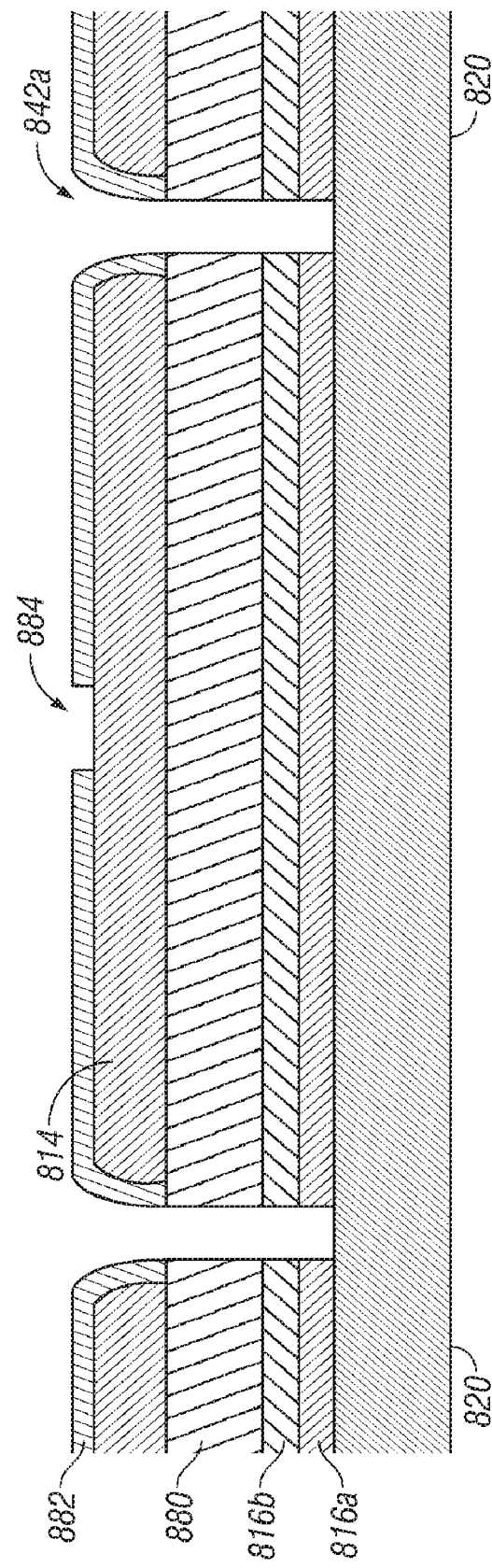

FIG. 8A illustrates a side cross-sectional view of an embodiment of an interferometric modulator 800 similar to the embodiment illustrated in FIG. 7D. Those skilled in the art will understand that certain features described with reference to the illustrated embodiment are also useful in other embodiments of interferometric modulators, including embodiments illustrated in FIGS. 7A-7C and 7E, as well as in other types of MEMS devices.

The interferometric modulator 800 comprises a substrate 820 on which is formed a conductive layer 816a and a partially reflective layer or absorber 816b, which form a portion of the optical stack 816. In the illustrated embodiment, an image is viewed through the substrate 820, which, consequently, is preferably transparent for the illustrated optical device and orientation. A deformable layer 834 is spaced from the optical stack 816 defining a gap or cavity 819 therebetween. A support structure maintaining the gap 819 comprises a plurality of support post plugs 842 extending between the substrate 820 and the deformable layer 834 in the illustrated embodiment, although rails, rivets, or other structures could serve as supports to space the MEMS electrodes apart in other arrangements. A movable reflective layer or mirror 814 is disposed in the cavity 819 and secured to the deformable layer 834. In the illustrated embodiment, the movable reflective layer 814 comprises an electrically conductive material and is electrically coupled to the deformable layer. It will be understood that, in other MEMS embodiments, the movable electrode need not be reflective, and may be formed by the deformable layer.

A first conformal layer 860 is formed in the cavity 819 over the components defining the cavity 819, for example, the partially reflective layer 816b, support post plugs 842, the movable reflective layer 814, and an inner surface 834a of the deformable layer. In some preferred embodiments, the thickness of the first conformal layer 860 is substantially uniform.

A second conformal layer 862 is disposed on an outer surface 834b of the deformable layer. In the illustrated embodiment, the thickness of the first conformal layer 860 and the second conformal layer 862 are substantially identical and have the same compositions. In the illustrated embodiment, the first 860 and second 862 conformal layers together encapsulate the deformable layer 834 and movable reflective layer 814. As discussed in greater detail below, preferably, the first 860 and second 862 conformal layers are formed simultaneously.

In some preferred embodiments, the first conformal layer 860 is a dielectric layer comprising at least one dielectric material. The second conformal layer 862 comprises the same material. The dielectric material is any suitable material known in the art. Where the device 800 is an interferometric modulator, the dielectric material is preferably substantially transparent to the relevant wavelengths of light. In some preferred embodiments, the dielectric material comprises materials that are depositable using atomic layer deposition (ALD), for example, oxides, nitrides, and combinations thereof. In some embodiments, the first conformal layer 860 comprises silicon dioxide ($SiO_2$, silica), alumina ($Al_2O_3$), or combinations of $SiO_2$ and $Al_2O_3$. In some embodiments, the first conformal layer 860 comprises a plurality of materials. For example, in some embodiments, the first conformal layer 860 comprises a plurality of sub-layers of dielectric materials, for example, a laminated structure. The interfaces between the sub-layers are abrupt or graded. Methods for forming the first 860 and second 862 conformal layers and engineering the material for particular functionality are discussed in greater detail below.

In these embodiments, a portion 860a of the first conformal layer formed over the partially reflective layer 816b and a portion 860b of the first conformal layer formed on a lower surface 814a of the movable reflective layer 814 together form a dielectric structure of the optical stack 816, which insulates the moving electrode 814 from the stationary electrode 816a/816b in the actuated position. In embodiments in which the thickness of the portions 860a and 816b are substantially identical, the resulting dielectric structure is referred to as "symmetric, for example, as a "symmetric oxide structure." Accordingly, in some embodiments, the thickness of the first conformal layer 860 is about one-half of the thickness of a similar, single-layer dielectric layer, for example, the dielectric layer of optical stack 16 illustrated in FIG. 7D. Those skilled in the art will understand that the thickness of the first conformal layer 860 depends on factors including the composition of the first conformal layer 860, the wavelengths of light modulated by the interferometric modulator 800, the desired mechanical properties of the first conformal layer 860, and the like. In some embodiments, the thickness of the first conformal layer 860 is not greater than about 100 nm (about 1000 Å), preferably, from about 50 Å to about 400 Å, more preferably, from about 100 Å to about 250 Å.

Embodiments of a dielectric first conformal layer 860 provide reduced interfacial adhesion or stiction between the portions 860a and 860b of the first conformal layer formed over the optical stack 816 and the movable layer 814, respectively, compared with similar devices comprising a single dielectric layer, for example, in the optical stack 16 of the embodiment illustrated in FIG. 7D.

The performance of MEMS devices in general and interferometric modulators in particular, may be adversely affected by a condition known in the art as "stiction." With reference to the device illustrated in FIG. 1, stiction can cause the actuated movable layer 14b to remain in contact with the optical stack 16b in the presence of a restoring force that would be expected to return the movable layer 14b to the relaxed position. Stiction occurs when the sum of adhesion forces biasing the device in the actuated position is greater than the restoring force biasing the device towards the relaxed position. The restoring force includes mechanical tension forces of the actuated movable layer 14b. Because surface or interfacial forces become relatively stronger with decreasing device dimensions and restoring forces become relatively weaker with decreasing device dimensions, stiction becomes more of a problem with decreasing device size, for example, in MEMS devices including interferometric modulators.

Adhesion forces are believed to originate from several sources, including, for example, capillary forces, van der Waals interactions, chemical bonding, and trapped charges. In all of these mechanisms, adhesion forces increase with increased contact area between relatively movable components, for example, the movable layer 14b and optical stack 16b, and decreases with increasing separation between the relatively movable components in the actuated state.

Returning to the embodiment illustrated in FIG. 8, large contact areas of hydrophilic materials such as silicon dioxide and/or alumina are typically believed to increase rather than decrease stiction. Without being bound by any theory, it is believed that stiction in some embodiments of interferometric modulators is caused at least in part by residues of the manufacturing process left in the cavity. For example, in forming the cavity using a release etch of a sacrificial material, non-volatile products of the etching process are left behind as manufacturing residues in the cavity. For example, in etching a molybdenum sacrificial layer using $XeF_2$, non-volatile products can include non-volatile molybdenum-containing products (for example, molybdenum oxide fluorides), non-volatile, non-molybdenum-containing products (for example, from impurities in the sacrificial layer), and the like. Other sources of manufacturing residues include reactions of the etchant with non-sacrificial materials, reactions of non-sacrificial materials exposed by the release etch, by-products formed in the deposition and/or etching of adjacent layers, and products of reactions between adjacent layers.

Embodiments of ALD form a layer that faithfully follows the contours of the underlying layer. Accordingly, in forming the first conformal layer 860 by ALD, the ALD grows not only the exposed substrate, but also any manufacturing residues disposed on the substrate, thereby evenly blanketing the exposed surfaces of the cavity. In blanketing the cavity, the first conformal layer 860 covers these manufacturing residues, thereby eliminating the contribution to stiction from the manufacturing residues. In some embodiments, the composition of the first conformal layer 860 is selected to reduce a contribution to stiction from cohesion between portion 860a (formed over the optical stack 816) and portion 860b (formed over the movable reflector 814) of the first conformal layer 860, which contact when the device 800 is in the actuated position.

Some embodiments also exhibit reduced surface charge build-up in the optical stack 816 compared with similar devices comprising a single dielectric layer, for example, the embodiment illustrated in FIG. 7D. It is believed that surface charges build up in traps in a dielectric layer, particularly, at or near the surface of the dielectric layer. Some of these traps are intrinsic, for example, formed during the deposition of the dielectric layer. The concentration of intrinsic traps in a dielectric layer depends on factors including the deposition method and the particular dielectric material deposited. Other traps are extrinsic, for example, formed by damage to the dielectric layer or be manufacturing residues.

Embodiments of the device 800 are believed to reduce surface charge build-up arising from intrinsic and/or extrinsic traps. For example, in some embodiments, the number of intrinsic traps is reduced by forming the first conformal layer 860 by atomic layer deposition (ALD), as discussed in greater detail below, which provides high-quality dielectric films with good insulating properties. Examples of suitable dielectric materials for ALD include $Al_2O_3$, $SiO_2$, and combinations thereof. As discussed below, in some embodiments, the first conformal layer 860 is formed after the release etch, which is among the last steps in manufacturing the interferometric modulator 800. In these embodiments, damage to the first conformal layer 860 is reduced because it is formed near the end of the manufacturing process, thereby reducing the number of extrinsic traps.

Moreover, as discussed above, in some embodiments, the first 860 and second 862 conformal layers encapsulate the deformable layer 834. In some embodiments, the mechanical and/or electrical properties of the deformable layer 834 are modified by the encapsulating first 860 and second 862 conformal layers. For example, in some embodiments the structural integrity of the deformable layer 834 is improved, particularly where the first 860 and second 862 conformal layers are relatively thick, for example, at least about 50 Å, at least about 100 Å, at least about 150 Å, or at least about 200 Å. The improved mechanical integrity in some of these embodiments provides improved the electrical integrity of the deformable layer 834. Some embodiments further exhibit operability over a wider temperature range. For example, in embodiments comprising a metal deformable layer 834 encapsulated by a first 860 and second 862 conformal layers comprising dielectric materials, the effective coefficient of thermal expansion of the encapsulated deformable layer 834 is lower than that of a similar unencapsulated deformable layer. This lower coefficient of thermal expansion permits stable operation of the MEMS 800 over a wider temperature range.

Figure 9:
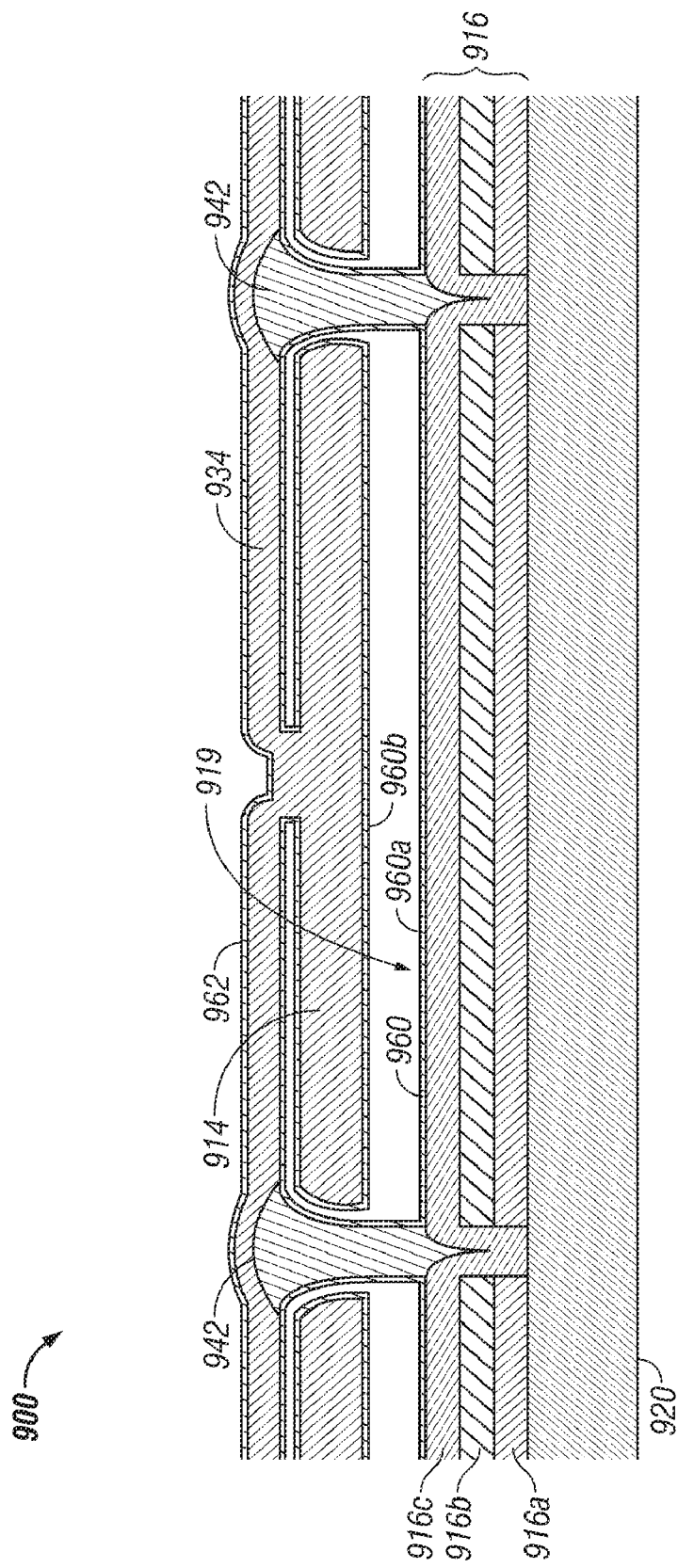
FIG. 9 illustrates a cross section of another embodiment of an interferometric modulator comprising a conformal dielectric layer formed in a cavity thereof.

Another embodiment of an interferometric modulator 900 is illustrated in a side cross-sectional view in FIG. 9. The interferometric modulator 900 is similar to the embodiment 800 illustrated in FIG. 8A, as well as the embodiment illustrated in FIG. 7D. Those skilled in the art will understand that some of the features are also useful in other embodiments, for example, with structures similar to those illustrated in FIGS. 7A-7C and 7E. In the illustrated embodiment, the device 900 comprises a substrate 920 on which is formed an optical stack 916 comprising a conductive layer 916a, a partially reflective layer 916b, and a primary dielectric layer 916c. As in the embodiment of FIG. 8A, the optical stack 916 represents a lower stationary electrode of the MEMS device. A support structure illustrated as comprising a plurality of support post plugs 942 extends from the optical stack 916 and supports a deformable layer 934. The optical stack 916 and deformable layer 934 define a cavity 919 in which is disposed a movable reflective layer 914 representing a movable electrode for the MEMS device, which is secured to the deformable layer 934.

A first conformal layer 960 is formed within the cavity 919 over the surfaces defining the cavity, including the dielectric layer 916c, the support post plugs 942, an inner surface of the deformable layer 934, and accessible surfaces of the movable reflective layer 914. A second conformal layer 962 is formed over an outer surface of the deformable layer 934. In some embodiments, the first 960 and second 962 conformal layers comprise the same materials as the first 860 and second 862 conformal layers of the embodiment illustrated in FIG. 8A. In some preferred embodiments, the thickness of the first conformal layer 960 is substantially uniform. In some embodiments, the thickness of second conformal layer 962 is substantially the same as the thickness of the first conformal layer 960. In embodiments in which the first 960 and second 962 conformal layers are formed by ALD, the thickness of the layers is at least the approximate thickness of a monolayer (about 3-5 Å) deposited by ALD. More preferably, the thickness of the first conformal layer 960 is at least about 10 Å, or at least about 80 Å. Because the optical dielectric system in this embodiment comprises the dielectric layer 916c as well as two layers of the first conformal layer 960, the thicknesses of these layers are selected to provide the desired optical properties. Desirably, the quality of the layers formed by the processes described below permit the total thickness of the optical dielectric system to be less than about 100 nm (1000 Å) while still functional to insulate the electrodes during operation.

In embodiments in which the first conformal layer 960 comprises a dielectric material, a portion 960a of the first conformal layer formed over the primary dielectric layer 916c, a portion 960b of the first conformal layer formed over a lower surface of the movable reflective layer 914, and the dielectric layer 916c together form a dielectric system. As discussed above for embodiments of the device 800 illustrated in FIG. 8A, in some embodiments, the total thickness of the dielectric system depends on the compositions of the first conformal layer 960 and the dielectric layer 916c, the wavelengths of light modulated by the interferometric modulator 900, the desired mechanical properties of the first conformal layer 960 and the dielectric layer 916c, and the like. In some embodiments, the first conformal layer 960 is relatively thin and does not substantially affect the optical properties of the dielectric system. In these embodiments, the optical properties of the dielectric system are dominated by the dielectric layer 916c.

In some preferred embodiments, the first conformal layer 960 acts as a stiction-reducing layer, as discussed above, for example, by covering or sealing manufacturing residues. In some embodiments, the first conformal layer, and in particular, the portion 960a, repairs or enhances the dielectric layer 916c by capping, filling, covering, and/or sealing defects in the dielectric layer 916c. Defects are often formed in the dielectric layer 916c in the fabrication of the device 900 using typical deposition techniques (CVD, PVD), and include, for example, pinholes, cracks, divots, and the like. In some embodiments, defects are formed in processes that subject the dielectric layer 916c to mechanical stress, for example, in a release etch and/or from thermal cycling. Such defects can affect electrical and/or mechanical properties of the device 900, for example, arising from undesired etching of an underlying layer. In some cases, the defect can lead to device failure. The first conformal layer 960 seals pinholes, thereby permitting the use of thinner dielectric layers 916c, which are more prone to developing pinholes. As discussed above, in some embodiments, the first conformal layer 960 is relatively thin.

Figure 10A:
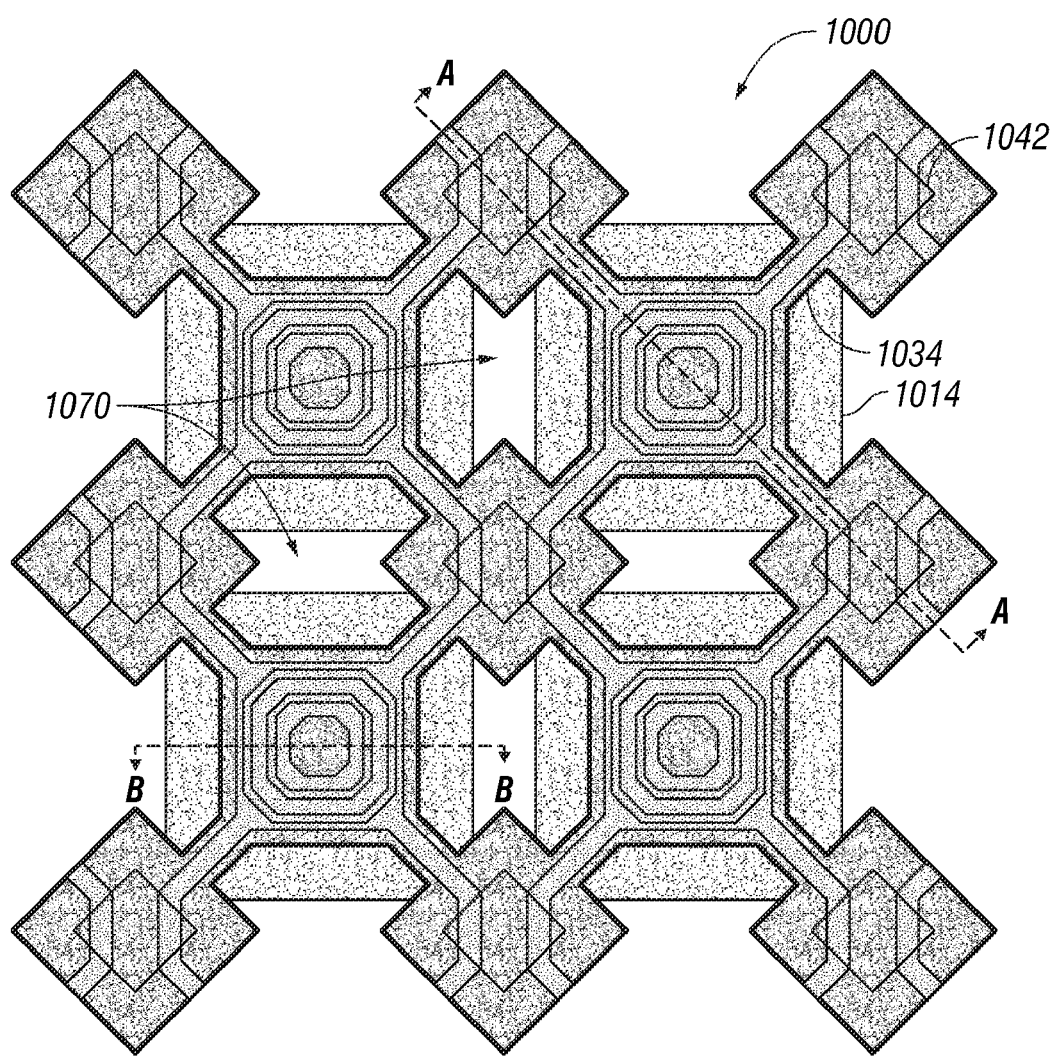
FIG. 10A illustrates a top view of an embodiment of an interferometric modulator comprising a non-conformal dielectric layer formed in a cavity thereof.

FIG. 10A illustrates a partial top plan view of an array of interferometric modulators 1000 similar to the embodiment illustrated in FIG. 7D. The interferometric modulator 1000 comprises a deformable layer 1034, movable reflective layer 1014, and support post plugs 1042. Also illustrated in FIG. 10A are a plurality of etch holes 1070 formed in the deformable layer 1034. In some embodiments, the etch holes 1070 permit contact between a vapor phase etchant and a sacrificial material in the manufacture of the interferometric modulator 1000, as discussed in greater detail below. It will be understood that the embodiments of FIGS. 8A and 9 also form part of an array of MEMS devices with similar etch holes in the deformable layer. Etch holes are not visible in FIGS. 8A and 9 because the cross sections are taken along sections that do not intersect any etch holes, for example, analogous to section A-A of FIG. 10A.

Figure 10B:
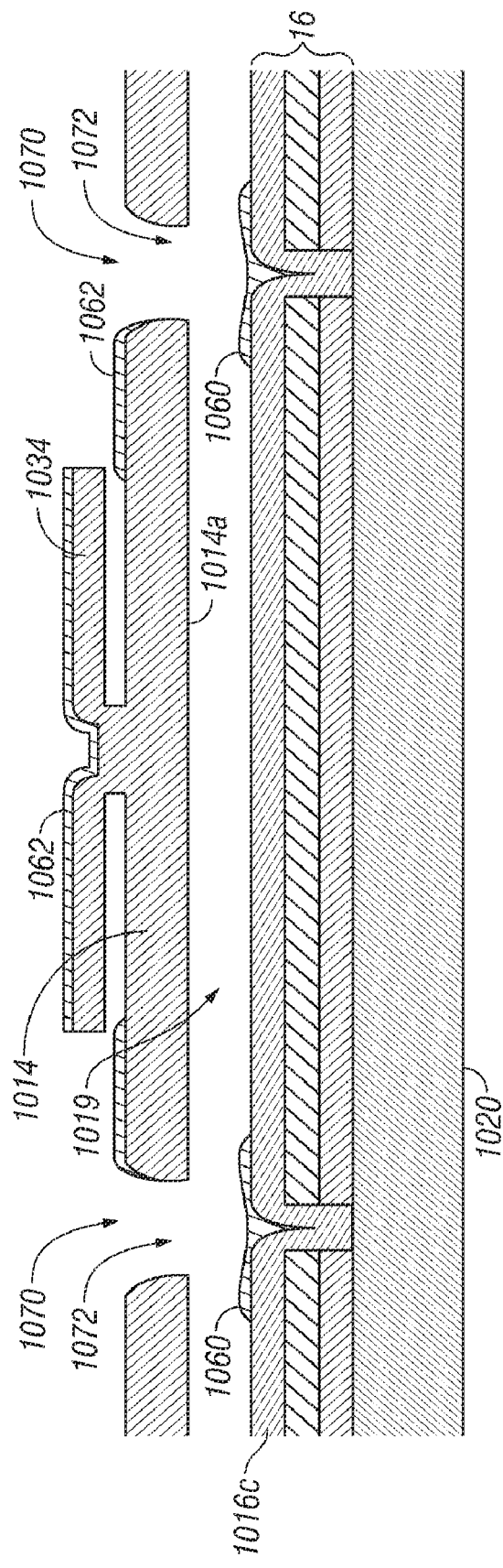
FIG. 10B illustrates a cross section of the interferometric modulator illustrated in FIG. 10B.

FIG. 10B illustrates a side cross-section taken along section B-B of FIG. 10A of an interferometric modulator 1000. The deformable layer 1034, movable reflective layer 1014, and etch holes 1070 described above are indicated. The interferometric modulator 1000 also comprises a substrate 1020 and an optical stack 1016 formed thereon, both of which are described in greater detail above. A cavity 1019 is defined by the optical stack 1016 and the deformable layer 1034.

Also indicated are locations 1072 on the substrate or optical stack within the cavity 1019 that are directly opposite from the etch holes 1070. These locations 1072 are directly exposed to the environment outside of the interferometric modulator. Centered at each these locations 1072 is a bump 1060 that is thicker in regions more exposed to the outside environment (for example, closer to the etch holes 1070), and thinner in regions less exposed to the outside environment (for example, more remote from the etch holes 1070). In the illustrated embodiment, the bumps 1060 are isolated from each other, forming a discontinuous, non-conformal layer. In other embodiments, the bumps 1060 merge, forming a substantially continuous, non-conformal layer of non-uniform thickness on the optical stack 1016. In other embodiments, the non-conformal layer 1060 comprises both continuous and isolated features. In the resulting cavity 1019, the bottom defined by the non-conformal layer 1060 and any exposed regions of the dielectric layer 1016c is not parallel with the lower surface 1014a of the movable reflective layer 1014.

In the illustrated embodiment, exposed portions of the deformable layer 1034 and the movable reflective layer 1014 also comprises layers 1062 of the material of islands 1060. In some embodiments, the material of the bumps are also partially or completely disposed over other portions of the device 1000, for example, the lower surface 1014a of the movable reflective layer, and/or areas between the deformable layer 1034 and the movable reflective layer 1014.

Figure 11:
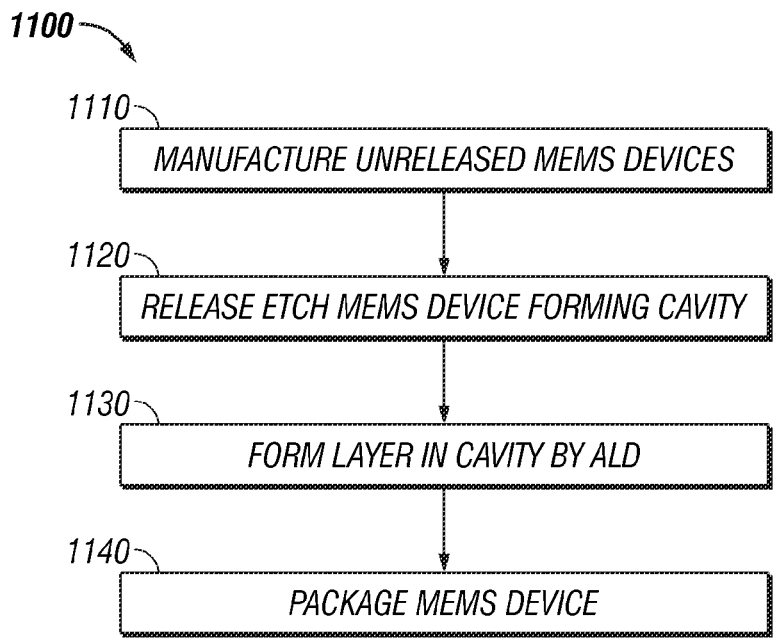
FIG. 11 is a flowchart illustrating an embodiment of a method for manufacturing embodiments of interferometric modulators illustrated in FIGS. 8A, 9, and 10A.

FIG. 11 is a flowchart illustrating an embodiment of a method 1100 for fabricating an interferometric modulator with reference to the embodiment illustrated in FIG. 8A. Those skilled in the art will understand that the method 1100 is also suitable for fabricating interferometric modulators and MEMS devices of other designs, for example, the embodiments illustrated in FIGS. 9, 10A, and 10B. The embodiment described below is similar to methods used in the manufacture of the embodiments illustrated in FIGS. 7A-7E, for example, as described in U.S. Patent Publication No. 2004/0051929 A1. Those skilled in the art will appreciate that the description set forth below omits certain details, for example, masking, patterning, etching steps, and the like, which are well known in the art. Additional structures, for example, etch stops, lift-off layers, and the like, are also used in some embodiments, as would be apparent to one skilled in the art.

In step 1110, an unreleased interferometric modulator is manufactured. In some embodiments for manufacturing an interferometric modulator as illustrated in FIG. 8A, in a first step, a conductive layer 816a, a partially reflective layer 816b, a first sacrificial layer 880, and a reflective layer 814 are successively deposited on a substrate 820 to provide the structure illustrated in FIG. 8B. Next, the reflective layer 814 is masked and etched to form the movable reflective layer 814, a second sacrificial layer 882 is formed thereover, and the resulting structure masked and etched to provide the structure illustrated in FIG. 8C. The etching produces openings 842a, which, in the illustrated embodiment, extend to the substrate 820, and openings 884, which extend to the movable reflective layer 814. The openings 842a are filled to form the support plug posts 842, and a deformable layer 834 is deposited over the support plug posts 842, the second sacrificial layer 882, and the portion of the movable reflective layer 814 exposed by the opening 884 to provide the structure illustrated in FIG. 8D.

In the fabrication of the embodiment illustrated in FIG. 9, in addition to the processes listed in the prior paragraph, a dielectric layer 916c is formed over the partially reflective layer 916b before depositing the first sacrificial layer.

In step 1120, the first 880 and second 882 sacrificial layers are etched away using one or more etch chemistries forming a cavity 819, thereby releasing the movable reflective layer 814 and deformable layer 834 to provide the structure illustrated in FIG. 8E. The etching of the sacrificial layers in step 1120 is also referred to as a "release etch" herein.

In preferred embodiments, the etchant is a vapor phase etchant, and the etching products are also in the vapor phase. For example, in some preferred embodiments, the etchant is $XeF_2$, which, at ambient temperature, is a solid with an appreciable vapor pressure (about 3.8 torr, 0.5 kPa at 25° C.). The vapor phase etchant contacts the sacrificial layers through etch holes, for example, as illustrated in FIGS. 10A and 10B as 1070.

Those skilled in the art will understand that the materials comprising the sacrificial layers are selected in conjunction with structural and/or non-sacrificial materials of the device 800 such that the sacrificial material(s) are selectively etched over the structural materials. In embodiments using $XeF_2$ as an etchant in the release etch, the sacrificial material comprises at least one of silicon, germanium, titanium, zirconium, hafnium, vanadium, tantalum, niobium, molybdenum, tungsten, and mixtures, alloys, and combinations thereof, preferably, molybdenum, tungsten, silicon, germanium, or silicon/molybdenum. In some embodiments, the sacrificial layer comprises an organic compound, for example, a polymer such as a photoresist. In some embodiments, a sacrificial layer comprises a single layer. In other embodiments, a sacrificial layer comprises a plurality of layers. Suitable structural materials are known in the art. Where the etchant comprises XeF$_2$, suitable structural materials resist etching by XeF$_2$, and include, for example, silica, alumina, oxides, nitrides, polymers, aluminum, nickel, and the like. In the embodiment illustrated in FIG. 8A, the partially reflective layer 816a comprises a material that is comparatively poorly etched in the release etch, for example, chromium where the etchant is XeF$_2$.

In step 1130, in the embodiment illustrated in FIG. 8A, a first conformal layer 860 is formed in the cavity 819. In preferred embodiments, the first conformal layer 860 is formed by atomic layer deposition (ALD). ALD deposits a film on all exposed surfaces of the device 800. Accordingly, both the first 860 and the second 862 conformal layers are formed in the same process to provide the structure illustrated in FIG. 8A. Embodiments of ALD permit the deposition of films of high optical and/or electrical quality.

Briefly, a layer or film of a material deposited or grown by ALD is formed one molecular layer of the material at a time through sequential reactions between a surface and pulses of at least a first precursor gas and a second reactant gas. The first precursor gas is the source of a first element of the ALD-deposited material, and the second reactant gas can be the source of a second element of the ALD-deposited material or can prepare the surface left by the prior pulse for further reaction. In a typical process, pulses of the first precursor gas contact a surface comprising functional groups with which the first precursor gas reacts (e.g., chemisorbs), thereby forming a first surface layer comprising the first element. The first surface layer is self-passivating with respect to the first precursor gas. Consequently, excess first precursor gas does not react with the first surface layer (e.g., the chemisorbed layer includes ligands that prevent further chemisorption beyond a monolayer), and as such, the reaction is self-limiting. Excess first precursor gas is then typically purged. The first surface layer is then contacted with pulses of the second reactant gas, with which it reacts to form a second surface layer that does not further react with the second reactant gas. Consequently, this step is also self-limiting. Excess second reactant gas is then typically purged. The second surface layer is reactive with the first precursor gas, however. Consequently, sequentially contacting the surface with the first precursor gas and the second reactant gas permits a user to deposit a layer of the desired thickness. To keep the deposition self-limiting to less than a monolayer per cycle, the reactants are kept separate by temporal pulsing and purging, or other removal of excess reactant and byproduct(s) between pulses.

Embodiments of ALD permits fine control of thickness of the deposited layer because the layer grows by the thickness of less than or equal to a molecular layer of the deposited material in each deposition cycle. For example, monolayers of Al$_2$O$_3$ are about 3-5 Å thick, and in some embodiments, are grown as about 1 Å thick submonolayers in each deposition cycle. Embodiments of ALD exhibit uniformity of thickness over a deposited area, for example, not greater than about 1% variation. Some embodiments exhibit 100% step coverage (SC) of surface features. The composition of the deposited layer is controllable by periodic substitution or additions of different reactants, permitting the manufacture of laminated and/or composite layers. Embodiments of ALD are performed at low temperatures, for example, about 80-500° C., more typically, about 100-400° C., and often at less than about 350° C.

As discussed above, in embodiments in which the device 800 is an interferometric modulator, the dielectric layers 860a and 860b of the first conformal layer form a dielectric structure of the optical stack. Consequently, in these embodiments, the first conformal layer 860 comprises a material with suitable optical properties, for example, substantial transparency. Because some preferred embodiments of the dielectric material are oxides, for example, silicon dioxide and/or aluminum oxide, the dielectric of an optical stack is also referred to as an "optical oxide." Suitable optical oxides formable by ALD are known in the art, for example, oxides and/or nitrides, preferably silicon dioxide, aluminum oxide, or combinations thereof.

Suitable conditions for depositing aluminum oxide by ALD are known in the art, which comprise contacting a surface with a pulse of an aluminum source gas followed by a pulse of an oxygen source gas. In some embodiments, aluminum oxide is deposited by ALD using trimethyl aluminum (TMA) as the precursor gas, and at least one of water (H$_2$O) and ozone (O$_3$) as the reactant gases. Other suitable source gases are known in the art.

In ALD of silicon dioxide, a surface is contacted with a pulse of a silicon source gas followed by an oxygen source gas. Suitable combinations of source gases include trimethylsilane and O$_3$/O$_2$; SiH$_2$Cl$_2$ and O$_3$; SiCl$_4$ and H$_2$O$_2$; and CH$_3$OSi(NCO)$_3$ and H$_2$O$_2$. Other conditions for depositing SiO$_2$ by ALD known in the art are used in other embodiments.

In some embodiments, the optical oxide comprises a conformal SiO$_2$/Al$_2$O$_3$ laminate or multilayered structure deposited, for example, by catalytic ALD using suitable aluminum source gases and silicon source gases known in the art, for example, trimethyl aluminum (TMA) and tris(t-butoxy)silanol.

In embodiments in which the device is not an optical modulator, for example, an electromechanical switch-type of MEMS device or other capacitive MEMS device, the first conformal layer need not be transparent. Accordingly, the composition of the first conformal layer can be selected based on other characteristics known in the art, for example, interfacial adhesion, dielectric constant (e.g., high-k or low-k materials), ease of deposition, and the like.

As discussed above, the embodiment illustrated in FIG. 8A comprises a symmetric oxide structure with equal thicknesses of the dielectric layers 860a and 860b on the electrodes 816 (optical stack) and 814 (movable reflective layer). Embodiments of devices comprising symmetrical oxide structures exhibit smaller offset voltages than similar devices not comprising symmetrical oxide structures, for example, the embodiment illustrated in FIG. 7D in which the dielectric layer is a single layer formed on the optical stack 16. An "offset voltage" is the difference (or "offset") between the actual center of the hysteresis curve for a device, for example, as illustrated in FIG. 3, and 0 V, which is the center of the hysteresis curve for an ideal device. In some embodiments, the driver (22, FIG. 2) compensates for the offsets in the interferometric modulators in an array. In some cases, compensation between all of the interferometric modulators in an array may not be possible, however. Embodiments of arrays of interferometric modulators 800 comprising symmetrical oxide structures exhibit reduced variation in offset voltages, thereby simplifying or reducing the need for compensation. In some preferred examples, the offset voltage is about 0 V, which is advantageous in capacitive MEMS devices.

In some embodiment in which the device 800 is an optical modulator, the reflectivity of the movable reflective layer 814 is reduced by about 5% by the portion of the conformal layer formed thereover 860b, a value which is acceptable in many applications.

Moreover, the illustrated process flow for FIGS. 8A-8E is more efficient than similar processes for fabricating an interferometric modulator illustrated in FIG. 7D, which comprises a dielectric layer 16c in the optical stack 16, saving at least one masking step since only unpatterned dielectric 860 is formed.

As discussed above, in embodiments of the device 900 illustrated in FIG. 9, the first conformal layer 960 is thinner than the first conformal layer 860 of the device illustrated in FIG. 8. In the device of FIG. 8, the first conformal layer 860 serves as the sole optical dielectric. In some embodiments of the device of FIG. 9, the first conformal layer 960 supplements the dielectric layer 916c as a component in an optical dielectric system.

In other embodiments, the layer formed in step 1130 is not a conformal layer, for example, the bumps or nonconformal layer 1060 illustrated in FIG. 10B. In some preferred embodiments, the island or layer 1060 is formed by ALD. In some embodiments, ALD pulsing is interrupted before conformality (saturation) is achieved, for example, by limiting contact between the device 1000 and the first precursor and/or second reactant gases, thereby forming a non-conformal layer 1060 by taking advantage of the depletion effect. For example, in some embodiments in which the bump or layer 1060 is $Al_2O_3$, the device 1000 is contacted with an aluminum source gas, thereby forming a monolayer of the aluminum source gas on the surfaces 1072 of the device 1000 near the etch holes 1070 on outside surfaces. After excess aluminum source gas is removed, the device is then contacted with an oxygen source gas. The oxygen source gas first reacts with the aluminum source gas monolayer at the most gas-accessible surfaces, for example, on the exposed surfaces of the deformable layer 1034 and movable reflective layer 1014, thereby forming an $Al_2O_3$ layer 1062. Locations 1072 on the substrate or optical stack proximate the etch holes 1070 are also relatively accessible, and consequently, reaction between the oxygen source gas and the aluminum source monolayer forms to non-conformal $Al_2O_3$ layer or bumps 1060. The oxygen source gas is controlled such that reaction with the aluminum source monolayer or sub-monolayer within other areas of the cavity 1019 is reduced and/or negligible, for example, by purging and/or by evacuation. In other embodiments, the aluminum source gas is limiting.

In some embodiments, a "non-ideal" ALD is performed in which the ALD reactions exhibit a "soft saturation," thereby providing the desired geometry of the layer 1060. For example, in some embodiments, an aluminum source gas exhibits "soft saturation" on a surface, which means that the monolayer formed on the surface is not initially uniform, but becomes uniform with time. Accordingly, in some embodiments, the aluminum source gas monolayer is contacted with the oxygen source gas before the aluminum source gas monolayer reaches uniformity. Those skilled in the art will understand that non-ideal ALD can be used to deposit other types of layers. For example, silicon source gases also exhibit soft saturation in some cases. Those skilled in the art will also understand that non-ideal ALD is applicable to devices with different structures and/or geometries.

In the embodiment illustrated in FIG. 8A, the second conformal layer 834 covers the deformable layer 834. Because the deformable layer 834 also carries electrical signals in the illustrated embodiment, electrical contact pads are provided on the deformable layer 834, which are potentially also covered by the second conformal layer in step 1130. In some embodiments, the contact pads are masked before ALD in step 1130. The contact pads are then exposed for electrical coupling thereto, for example, by lift-off of the mask protecting the pads. Suitable masks are known in the art, for example, photoresists. In some embodiments, the entire deformable layer 834 is masked and the entire second conformal layer 862 is removed.

In some embodiments, the second conformal layer 862 (FIG. 8A), layer 1062 (FIG. 10B), and especially layer 962 (FIG. 9) is so thin that a conventional bonding process, for example, wire or solder bonding, breaks through the layer, sufficiently to permit electrical coupling between the contact pad and a lead.

In some embodiments, at least a portion of the second conformal layer 862 disposed over the contact pad is etched using any suitable etching process. A suitable etchant for both $SiO_2$ and $Al_2O_3$ is HF, either dry (vapor) or wet (aqueous). Other suitable etching processes include dry etches, for example, plasma etching. The second conformal layer 862 is masked or unmasked. In preferred embodiments, the etchant, as a liquid composition, is applied directly to the second conformal layer 862 on a contact pad, thereby etching only the desired portion of the second conformal layer 862. In some embodiments, the liquid etching composition is applied to the second conformal layer 862 by dipping or wiping. In some embodiments, the etchant is applied after the device 800 is packaged and the array of MEMS devices protected from the etchant by a sealed backplate while the contact pads are exposed outside the seal.

Figure 12A:
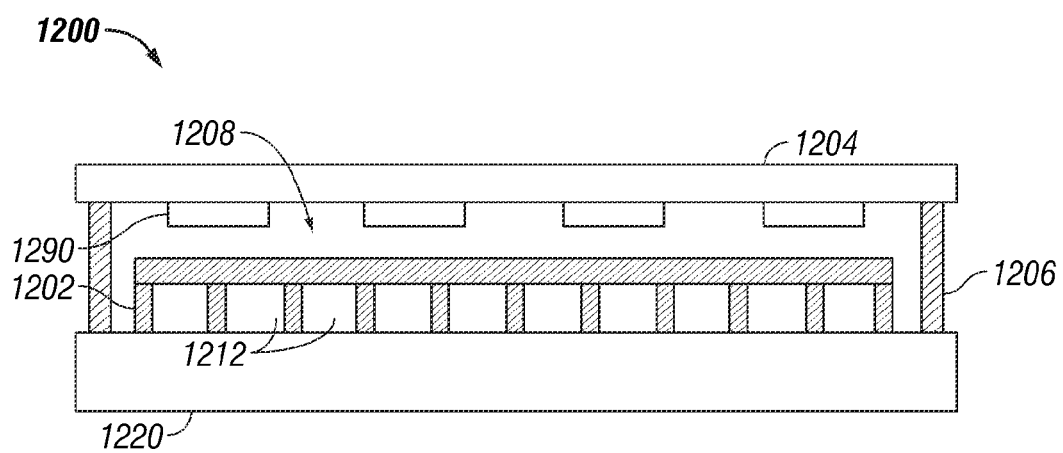
FIG. 12A illustrates a cross-section of an embodiment of a packaged interferometric modulator.
Figure 12B:
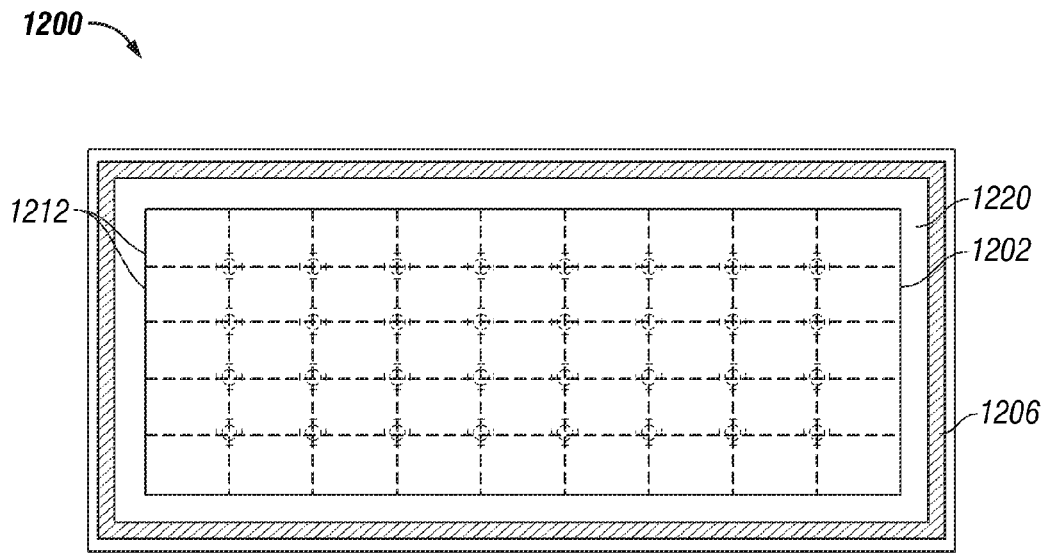
FIG. 12B illustrates a top view of an embodiment of a packaged interferometric modulator with the backplate removed.

In step 1140, the interferometric modulator is packaged, typically as an element in an array of interferometric modulators. The embodiment of a packaged device 1200 illustrated in cross section in FIG. 12A comprises an array 1202 of interferometric modulators 1212 formed on a substrate 1220. A backplate 1204 is positioned above the array 1202. A seal 1206 circumscribing the array 1202 extends between the substrate 1220 and backplate 1204, which together define a volume 1208 enclosing the array 1202 therein. In some embodiments, a desiccant 1290 is disposed in the volume 1208. FIG. 12B is a top view of the packaged device 1200 with the backplate removed, illustrating an exemplary arrangement of the substrate 1220, array 1202 of interferometric modulators 1212, and seal 1206. Embodiments of the packaging protect the array 1202 from physical damage. In some embodiments the packaging forms a hermetic or semi-hermetic seal, which prevents entry of foreign substances or objects, for example, dust, water, and/or water vapor.

Embodiments of the backplate 1204 are partially or totally opaque, translucent, and/or transparent. In preferred embodiments, the backplate 1204 comprises a material that does not produce or outgas a volatile compound. Preferably, the backplate 1204 is substantially impermeable to liquid water and water vapor. In some embodiments, the backplate 1204 is substantially impermeable to air and/or other gases. Suitable materials for the backplate 1204 include, for example, metals, steel, stainless steel, brass, titanium, magnesium, aluminum, polymer resins, epoxies, polyamides, polyalkenes, polyesters, polysulfones, polyethers, polycarbonates, polyetheramides, polystyrene, polyurethanes, polyacrylates, parylene, ceramics, glass, silica, alumina, and blends, copolymers, alloys, composites, and/or combinations thereof. Examples of suitable composite materials include composite films available from Vitex Systems (San Jose, Calif.). In some embodiments, the backplate 1204 further comprises a reinforcement, for example, fibers and/or a fabric, for example, glass, metal, carbon, boron, carbon nanotubes, and the like.

In some embodiments, the backplate 1204 is substantially rigid or flexible, for example, foil or film. In some embodiments, the backplate 1204 is deformed into a predetermined configuration before and/or during assembly of the package structure in step 1440. Those skilled in the art will understand that the thickness of the backplate 1204 will depend on factors including the properties of the material(s) and their shapes. In some embodiments, the thickness of the backplate is from about 0.1 mm to about 5 mm, preferably, from about 0.2 mm to about 2 mm.

In the illustrated embodiments, the seal 1206 secures the backplate 1204 to the substrate 1220. In some embodiments, the seal 1206 does not produce or outgas a volatile compound, for example, hydrocarbons, acids, amines, and the like. In some embodiments, the seal 1206 is partially or substantially impermeable to liquid water and/or water vapor, forming a hermetic or semi-hermitic seal. In preferred embodiments, the seal 1206 comprises one or more adhesives compatible with the substrate 1220 and backplate 1204. The adhesive or adhesives are of suitable any type known in the art, applied and cured by any suitable method. In some embodiments, one or more of the adhesives is pressure sensitive.

The seal 1206 comprises any suitable material, for example, polymer resins, epoxies, polyamides, polyalkenes, polyesters, polysulfones, polystyrene, polyurethanes, polyacrylates, cyanoacrylates, acrylic epoxies, silicones, rubbers, polyisobutylene, neoprene, polyisoprene, styrene-butadiene, parylene, U.V.-curable adhesives, radiation-curable adhesives, photoresists, and blends, copolymers, alloys, and/or composites thereof.

In some embodiments, the seal is less than about 50 μm thick, for example, from about 10 μm to about 30 μm thick. In some embodiments, the seal is from about 0.5 mm to about 5 mm wide, for example, from about 1 mm to about 2 mm.

In some embodiments, packaging in step 1140 is performed after forming the first conformal layer 860 or 960 in step 1130, as shown in FIG. 11. In other embodiments, the packaging step is performed before the release etch in step 1120 and before forming the ALD layer. It is believed that in forming the ALD layer after packaging, the layer is formed over residues formed during the packaging process, for example, residues formed in curing an adhesive seal, thereby reducing a component of stiction stemming from these residues.

Figure 8D:
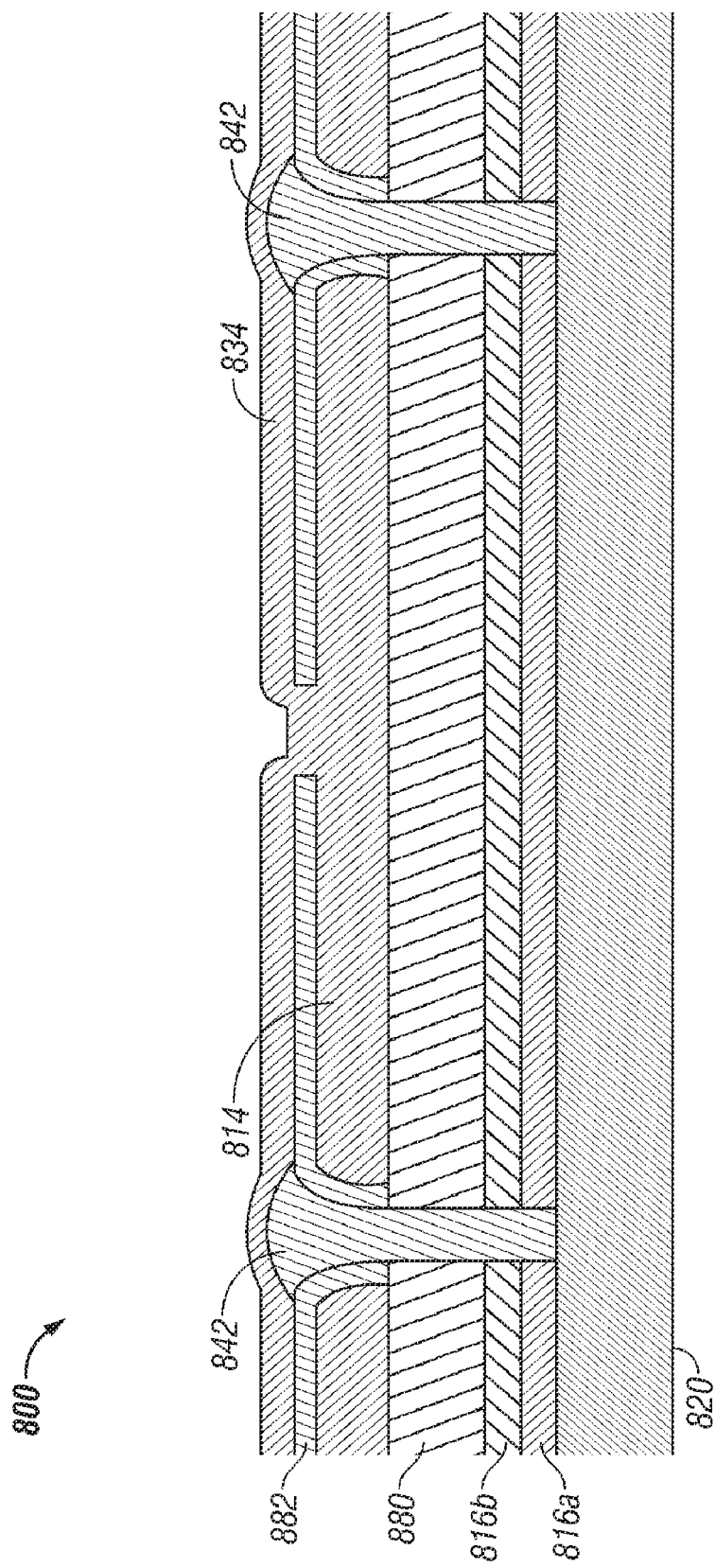
Figure 12C:
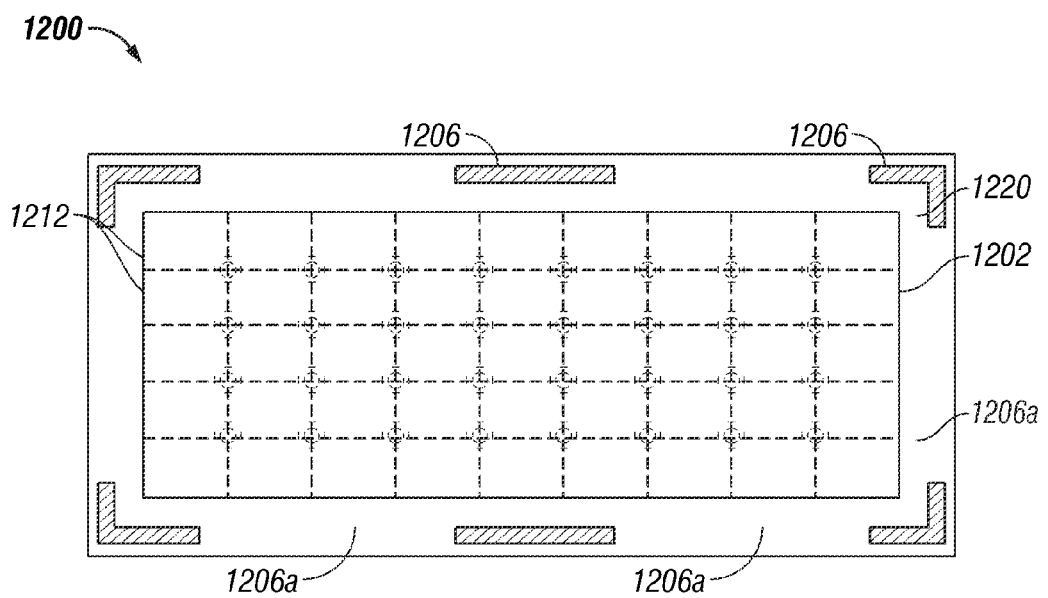
FIG. 12C illustrates a top view of an embodiment of a packaged interferometric modulator with openings in seal.

In some of these embodiments, the seal 1206 is formed in two stages. The first stage comprises forming a seal 1206 comprising one or more openings 1206a as illustrated in FIG. 12C. The openings 1206a permit gases or vapors to enter the package 1200, and thereby contact the interferometric modulators 1212, as well as permitting gases or vapors to leave the package 1200. In some embodiments, the openings 1206a also permit pressure to equalize between the interior and exterior of the package. In some embodiments, an array 1202 comprises unreleased interferometric modulators, for example, as illustrated in FIG. 8D are packaged in step 1140, after which a release etch is performed in step 1120 in which a vapor phase etchant contacts the interferometric modulators 1212 and vapor phase etching products are removed through openings 1206a. Similarly, in step 1130, process gases access the released optical modulator through openings 1206a, and any vapor phase side products are removed therethrough. Those skilled in the art will understand that, in some embodiments, the array 1202 is packaged in step 1140 after the release etch in step 1120 and before forming the first conformal layer in step 1130, for example, using the configuration illustrated in FIG. 12C.

The openings 1206a are formed by any means known in the art. For example, in some embodiments, a seal 1206 is formed on the substrate 1220 and/or backplate 1204, after which one or more portions of a seal 1206 are removed, for example, physically (e.g., machining, grinding, abrading, blasting, cutting, drilling, boring, melting, ablating, etc.) and/or chemically (e.g., etching, dissolving, burning-off). In other embodiments, the openings 1206a and seal 1206 are formed concurrently on the substrate 1220 and/or backplate 1204, for example, by patterning. In other embodiments, the seal 1206 comprises preformed components, which are secured to the substrate 1220 and/or backplate 1204, thereby forming the openings 1206a.

Figure 12D:
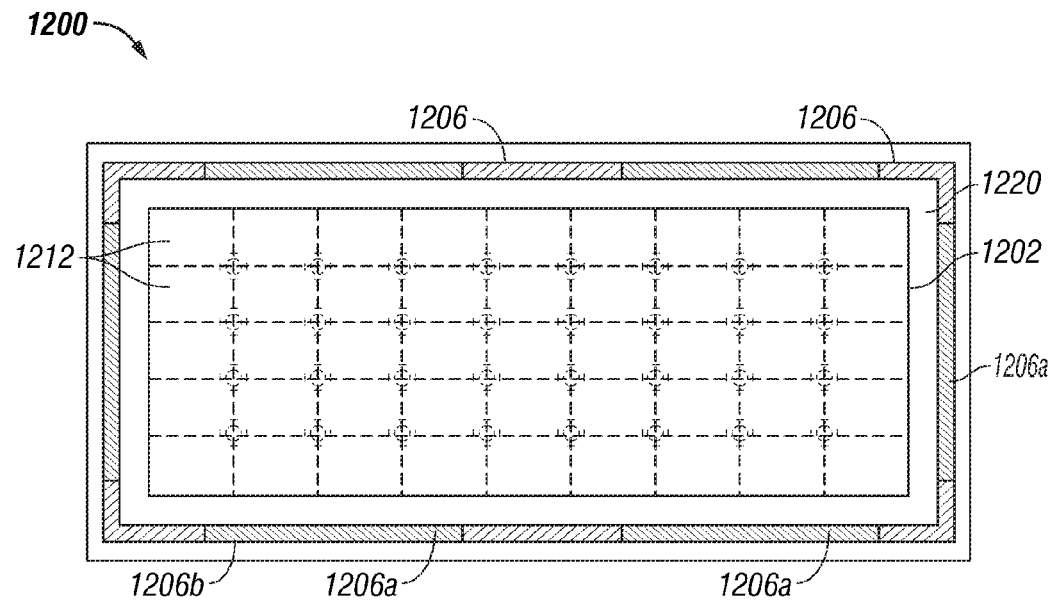
FIGS. 12D-12F illustrate top views of embodiments of the packaged interferometric modulator of FIG. 12C in which the openings in the seal are filled.
Figure 12E:
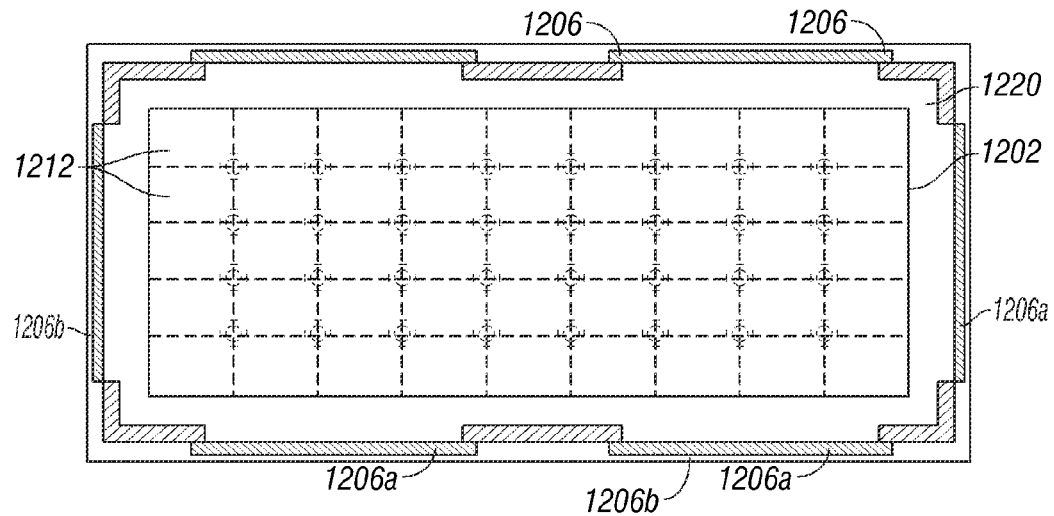
Figure 12F:
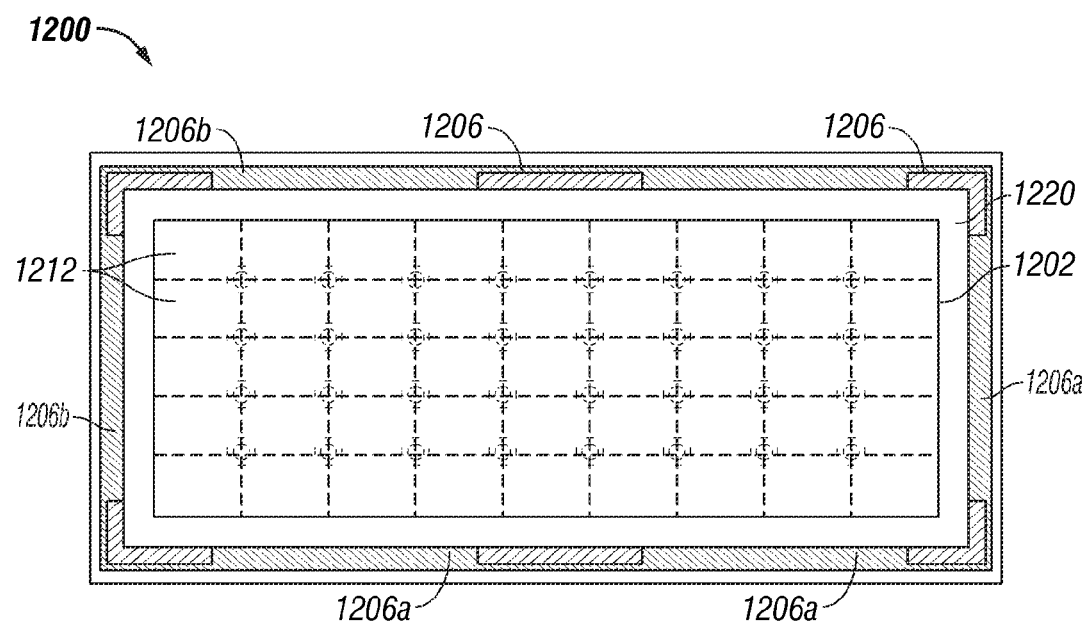

In some of these embodiments, the openings 1206a are filled in a second stage after fabrication of the interferometric modulator 1212 is completed, for example, after the release etch and ALD coating, using the same or different material as the seal 1206. In some embodiments, a filler 1206b is disposed substantially in the openings 1206a to provide the structure illustrated in FIG. 12D. In other embodiments, the filler 1206b seals the openings 1206a, but does not fill them, for example, as illustrated in FIG. 12E, in which the filler 1206b is disposed around at least a portion of the perimeter of the seal 1206. In other embodiments, the filler 1206b is disposed both around at least a portion of the perimeter of the seal 1206, as well as at least partially filling the openings 1206a, for example, as illustrated in FIG. 12F.

The filler 1206b is applied by any suitable method. In some embodiments, the filler 1206b is applied in an uncured state and cured in place, for example, by irradiation, thermal curing, chemical curing, UV-irradiation, electron beam irradiation, combinations thereof, and the like. For example, in some preferred embodiments, the filler 1206b comprises an uncured polymer. Preferably, the uncured polymer is applied in a fluid state, for example, as a liquid, a gel, a paste, or the like. In other embodiments, the filler 1206b is not cured. For example, in some embodiments, the filler comprises a heat-shrinkable material, for example, thermoplastics, polyolefins, fluoropolymers, polyvinyl chloride (PVC), neoprene, silicone elastomers, fluoropolymer elastomers (e.g., Viton®), and the like.

Without being bound by any theory, it is believed that at least a portion of the stiction observed in embodiments of MEMS devices, for example, interferometric modulators, arises from residues or other contaminants, for example, etching residues, formed or left behind in the manufacturing process. These residues are believed to increase interfacial adhesion between moving parts. For example, in the embodiment illustrated in FIG. 7D, it is believed that the release etch leaves etching residues in the cavity 19, and in particular, between the movable reflective layer 14 and optical stack 16, thereby leading to stiction between these components. In contrast, in the embodiment illustrated in FIGS. 8A-8E, the release etch 1120 provides the released device 800 illustrated in FIG. 8E. Stiction-inducing residues are possibly left on the lower surface 814a of the movable reflective layer and/or the partially reflective layer 816b. In step 1130, the entire cavity 819, including any etching residues, is covered by the first conformal layer 860, thereby eliminating their contribution to stiction.

The device illustrated in FIG. 9 is believed to provide reduced stiction by a similar mechanism. A similar mechanism is also believed to be operative in the device illustrated in FIG. 10B comprising a substantially continuous, non-conformal layer 1060.

Figure 10C:
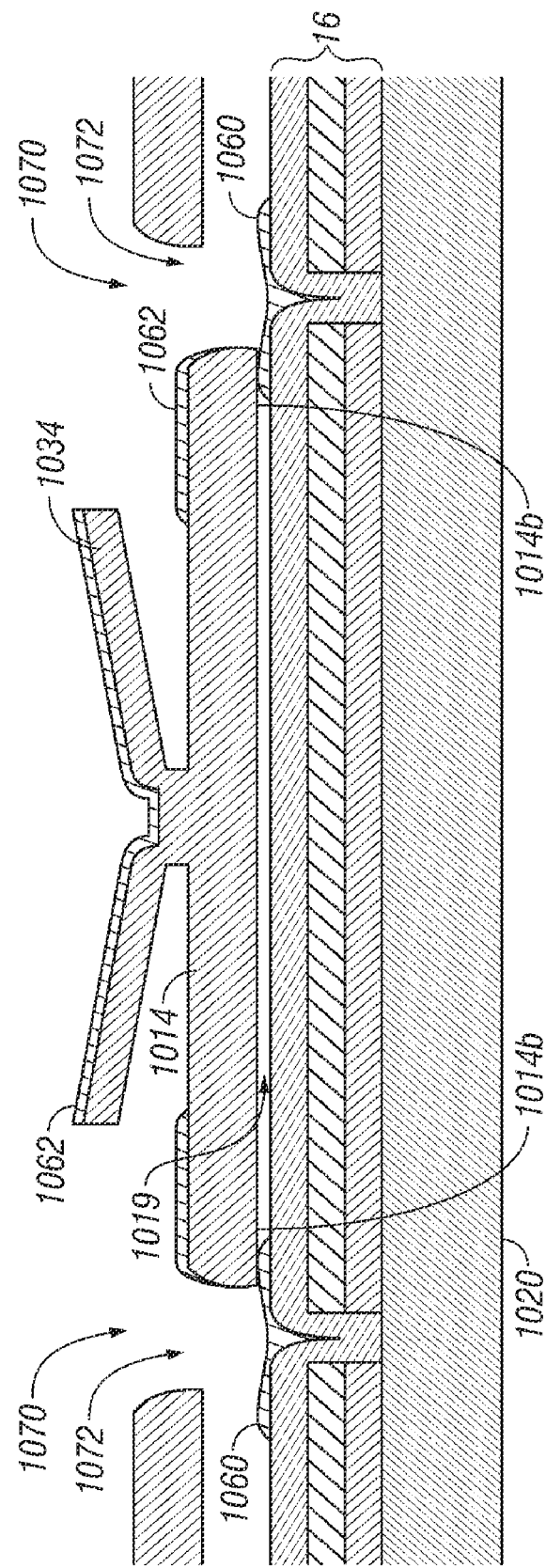
FIGS. 10C and 10D illustrate cross sections of the interferometric modulator illustrated in FIGS. 10A and 10B in actuated positions.
Figure 10D:
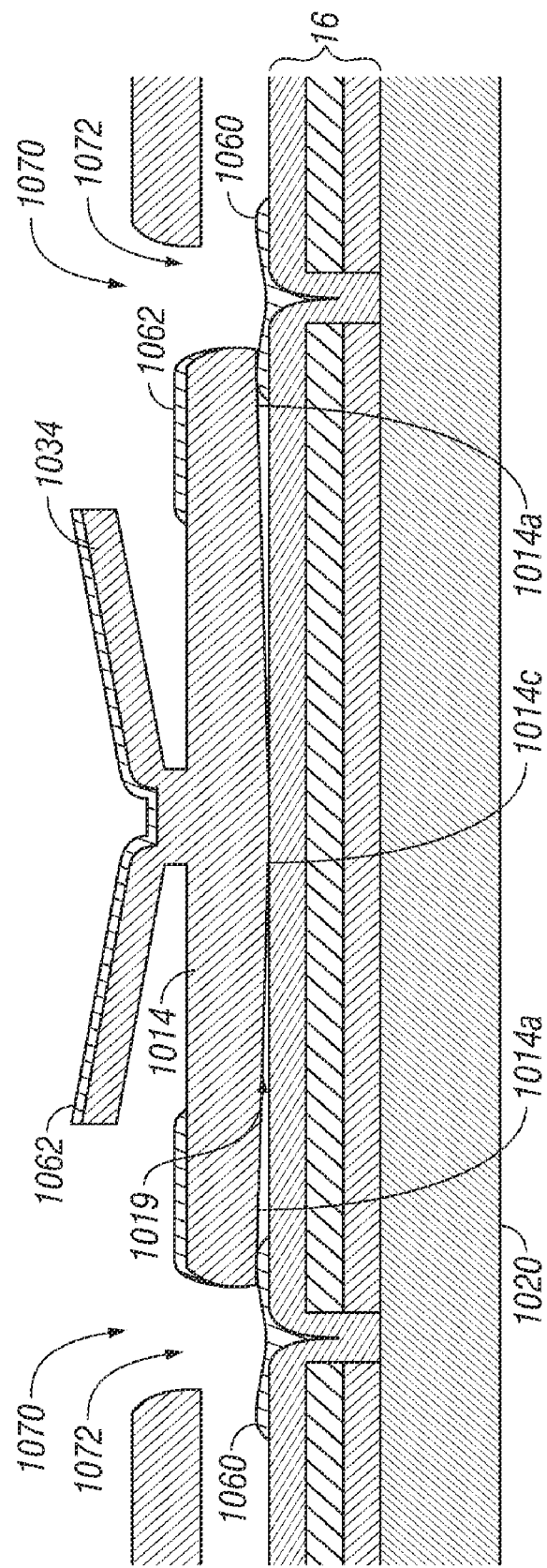

Another mechanism believed to operate in the device 1000 illustrated in FIG. 10B is the non-conformal layer and/or bumps 1060 reduce the contact area between the dielectric layer 1016c and the movable reflective layer 1014, thereby reducing stiction. It is believed that uneven or non-parallel surfaces exhibit reduced stiction. FIG. 10C illustrates the device 1000 in an actuated position in which the edges of the movable reflective layer 1014b contact the non-conformal layer 1060 and the movable reflective layer 1014 substantially does not contact the dielectric layer 1016c. The resulting cavity 1019 is smaller compared with the cavity 1019 of the embodiment illustrated in FIG. 10B. In the embodiment illustrated in FIG. 10D, the movable reflective layer 1014 contacts the non-conformal layer and/or bumps 1060 at the edges 1014b. In the illustrated embodiment, the movable reflective layer 1014 flexes, thereby contacting a central portion 1014c of the movable reflective layer with the dielectric layer 1016c. In the illustrated position, the movable reflective layer 1014 is similar to a leaf spring under tension. As such, a restoring force tends to urge the movable reflective layer 1014 back into its planar configuration, for example, as illustrated in FIG. 10C, thereby counteracting any adhesion between the central portion 1014c of the movable reflective layer and the dielectric layer 1016c.

Those skilled in the art will understand that changes in the apparatus and manufacturing process described above are possible, for example, adding and/or removing components and/or steps, and/or changing their orders. Moreover, the methods, structures, and systems described herein are useful for fabricating other electronic devices, including other types of MEMS devices, for example, other types of optical modulators.

Moreover, while the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. An optical interferometric modulator comprising:
    an optical stack comprising a partial reflector and a primary dielectric layer,
    a reflective layer movable relative to the optical stack;
    a cavity defined by the optical stack and the reflective layer; and
    a supplemental conformal dielectric layer as part of an optical dielectric layer within the cavity, wherein the supplemental dielectric layer has a thickness of at least about 10 Å over each of the primary dielectric layer and the reflective layer within the cavity, the optical dielectric layer including the primary dielectric layer and the supplemental dielectric layer over both the optical stack and the reflective layer, wherein the thickness of the supplemental dielectric layer affects the optical properties of the interferometric modulator, and wherein a total thickness of the optical dielectric layer depends upon the thicknesses of the supplemental dielectric layer and the primary dielectric layer.

2. The optical interferometric modulator of claim 1, further comprising a deformable layer coupled to the reflective layer.

3. The optical interferometric modulator of claim 1, wherein the supplemental conformal dielectric layer comprises at least one of $SiO_2$ and $Al_2O_3$.

4. The optical interferometric modulator of claim 1, wherein the thickness of the supplemental conformal dielectric layer is from about 50 Å to about 400 Å.

5. The optical interferometric modulator of claim 1, wherein the thickness of the optical dielectric layer is less than about 100 nm.

6. The optical interferometric modulator of claim 1, wherein the supplemental dielectric layer over the reflective layer reduces the reflectivity of the reflective layer by about 5%.

7. A display comprising an array of optical interferometric modulators each like the optical interferometric modulator of claim 1, further comprising:
    a seal circumscribing the optical interferometric modulator; and
    a backplate secured to the seal.

8. An apparatus comprising:
    the display of claim 7;
    a processor that is configured to communicate with said display, said processor being configured to process image data; and
    a memory device that is configured to communicate with said processor.

9. The apparatus of claim 8, further comprising a driver circuit configured to send at least one signal to the display.

10. The apparatus of claim 9, further comprising a controller configured to send at least a portion of the image data to the driver circuit.

11. The apparatus of claim 8, further comprising an image source module configured to send said image data to said processor.

12. The apparatus of claim 11, wherein the image source module comprises at least one, of a receiver, transceiver, and transmitter.

13. The apparatus of claim 8, further comprising an input device configured to receive input data and to communicate said input data to said processor.

14. The optical interferometric modulator of claim 1, wherein the thickness of the supplemental conformal dielectric layer is from about 100 Å to about 250 Å.

15. An optical interferometric modulator comprising:
    a means for partially reflecting light;
    a movable means for actuating the optical interferometric modulator and for reflecting light; and
    a supplemental dielectric means for covering both the means for partially reflecting light and a facing surface of the movable means, wherein the supplemental dielectric means and the means for partially reflecting light cooperate to define an optical dielectric means for establishing an optical path length and reflected wavelength maximized by optical interference, wherein a thickness of the supplemental dielectric means affects the optical properties of the interferometric modulator.

16. An electromechanical systems device comprising:
    a substrate comprising a first face;
    a deformable layer comprising a first face and a second face;
    a variably-sized cavity comprising opposite internal surfaces defined by the first face of the substrate and the first face of the deformable layer;
    a plurality of openings in the deformable layer; and
    a dielectric layer in the cavity formed over the first face of the substrate and the first face of the deformable layer, wherein the dielectric layer is thicker over a plurality of locations on the first face of the substrate opposite from the openings in the deformable layer than over another location on the first face of the substrate.

17. The electromechanical systems device of claim 16, wherein the dielectric layer is additionally formed over the second face of the deformable layer.

18. The electromechanical systems device of claim 16, further comprising a movable conductor disposed in the cavity and secured to the deformable layer, wherein the movable conductor comprises a surface proximal to the substrate, and a portion of the dielectric layer is formed over the surface of the movable conductor proximal to the substrate.

* * * * *

UNITED STATES PATENT AND TRADEMARK OFFICE
CERTIFICATE OF CORRECTION

PATENT NO. : 8,164,815 B2
APPLICATION NO. : 12/795294
DATED : April 24, 2012
INVENTOR(S) : Ana R. Londergan et al.

It is certified that error appears in the above-identified patent and that said Letters Patent is hereby corrected as shown below:

On Title page 4, (item 56), line 37, under Other Publications, please remove "Aluminoa" and insert therefor, --Alumina--.

On Title page 4, (item 56), line 46, under Other Publications, please remove "compatable" and insert therefor, --compatible--.

On Title page 4, (item 56), line 50, under Other Publications, please remove "vo" and insert therefor, --vol.--.

On Title page 4, (item 56), line 55, under Other Publications, please remove "inteferometric" and insert therefor, --interferometric--.

On Title page 4, (item 56), line 56, under Other Publications, please remove "capacitiive" and insert therefor, --capacitive--.

On Title page 4, (item 56), line 64, under Other Publications, please remove "SiO2,"" and insert therefor, --$SiO_2$,--.

On Title page 5, (item 56), line 16, under Other Publications, please remove "XeF2" and insert therefor, --$XeF_2$--.

On Title page 5, (item 56), line 1, under Other Publications, please remove "BrF3" and insert therefor, --$BrF_3$--.

At column 5, line 1, please remove "minor" and insert therefor, --mirror--.

At column 8, line 65, please remove "respectively" and insert therefor, --respectively.--.

At column 9, line 22, please remove "to +5 volts," and insert therefor, --to -5 volts,--.

At column 24, line 33, please remove "fluorpolymers" and insert therefor, --fluoropolymers--.

At column 25, approximately line 37, in Claim 1, please remove "layer," and insert therefor, --layer;--.

Signed and Sealed this
Eighteenth Day of December, 2012

David J. Kappos
*Director of the United States Patent and Trademark Office*

At column 26, approximately line 22, in Claim 12, please remove "one," and insert therefor, --one--.